United States Patent [19]

Hudson et al.

[11] Patent Number: 5,159,534

[45] Date of Patent: Oct. 27, 1992

[54] ELECTRONIC/ELECTROMECHANICAL PACKAGING ARRANGEMENT FOR FACILITY MANAGEMENT SYSTEM

[75] Inventors: Hugh F. Hudson, Wauwatosa, Wis.; Joseph F. Munsch, Boulder Creek; Joseph A. McArdle, Mountain View, both of Calif.; Gene D. Goetz, Shorewood, Wis.; Christopher M. Bonin; Jeffery S. Kunkler, both of Milwaukee, Wis.; Quentin Morgan, Seattle, Wash.

[73] Assignee: Johnson Service Company, Milwaukee, Wis.

[21] Appl. No.: 644,341

[22] Filed: Jan. 22, 1991

[51] Int. Cl.$^5$ .................. H05K 7/14; H05K 7/18; H05K 7/20

[52] U.S. Cl. .................. 361/391; 361/383; 361/386; 361/388; 361/395; 361/415

[58] Field of Search ............... 361/383, 386, 388, 391, 361/395, 399, 415; 174/51; 312/292

[56] References Cited

U.S. PATENT DOCUMENTS

| | | | |
|---|---|---|---|
| 3,573,558 | 4/1971 | Babcock | 361/399 |
| 3,631,299 | 12/1971 | Meyer et al. | 361/399 |
| 3,829,741 | 8/1974 | Athey | 361/399 |
| 3,853,379 | 12/1974 | Goodman et al. | 361/391 X |
| 4,068,290 | 1/1978 | Wetherbee | 361/415 |
| 4,152,750 | 5/1979 | Bremenour et al. | 361/383 |
| 4,197,572 | 4/1980 | Aimar | 361/399 |
| 4,233,646 | 11/1980 | Leung et al. | 361/399 |
| 4,236,190 | 11/1980 | Hollingsead et al. | 361/391 |
| 4,247,882 | 1/1981 | Prager et al. | 361/395 X |
| 4,334,261 | 6/1982 | Gonzales | 361/415 X |
| 4,434,537 | 3/1984 | Beun et al. | 361/395 X |
| 4,488,013 | 12/1984 | Ziegler | 174/51 X |
| 4,563,725 | 1/1986 | Kirby | 361/388 |
| 4,580,192 | 4/1986 | Beun | 361/395 |
| 4,591,950 | 5/1986 | Houpt | 361/399 |
| 4,621,304 | 11/1986 | Oogaki et al. | 361/386 |
| 4,628,407 | 12/1986 | August et al. | 361/388 |
| 4,648,009 | 3/1987 | Beun et al. | 361/399 |
| 4,672,511 | 6/1987 | Meusel et al. | 361/415 |
| 4,692,571 | 9/1987 | Trinh et al. | 361/399 X |
| 4,698,024 | 10/1987 | Maxwell | 361/399 X |
| 4,712,159 | 12/1987 | Clemens | 361/386 |
| 4,729,614 | 3/1988 | Nadler et al. | 312/292 |
| 4,802,532 | 2/1989 | Davies et al. | 361/383 X |
| 4,821,145 | 4/1989 | Corfits et al. | 361/383 |
| 4,821,146 | 4/1989 | Behrens et al. | 361/383 |
| 4,853,830 | 8/1989 | Corfits et al. | 361/415 X |
| 4,920,453 | 4/1990 | Onose et al. | 361/392 |
| 4,922,376 | 5/1990 | Pommer et al. | 361/386 |
| 4,931,907 | 6/1990 | Robinson et al. | 361/391 |
| 4,939,623 | 7/1990 | Equi et al. | 361/399 |
| 4,947,289 | 8/1990 | Dynie | 361/415 |
| 4,956,750 | 9/1990 | Maggelet | 361/415 |
| 4,960,384 | 10/1990 | Singer et al. | 361/391 X |
| 4,972,296 | 11/1990 | Chu | 361/395 X |
| 4,985,803 | 1/1991 | Pum et al. | 361/383 |
| 4,991,056 | 2/1991 | Shimizu et al. | 361/395 X |
| 5,032,951 | 7/1991 | Schropp et al. | 361/415 X |
| 5,043,847 | 8/1991 | Deinhardt et al. | 361/395 |
| 5,045,960 | 9/1991 | Eding | 361/391 X |
| 5,045,977 | 9/1991 | Cesar | 361/424 |
| 5,050,040 | 9/1991 | Gondusky et al. | 361/388 |
| 5,065,141 | 11/1991 | Whitsitt | 361/415 X |

FOREIGN PATENT DOCUMENTS

| | | | |
|---|---|---|---|
| 109557 | 5/1984 | European Pat. Off. | 361/415 |
| 333618 | 9/1989 | European Pat. Off. | 361/415 |
| 3502584 | 7/1986 | Fed. Rep. of Germany | 361/386 |
| 3525583 | 1/1987 | Fed. Rep. of Germany | 361/415 |
| 3630397 | 3/1988 | Fed. Rep. of Germany | 361/399 |
| 2649854 | 1/1991 | France | 361/399 |

*Primary Examiner*—Leo P. Picard
*Assistant Examiner*—Michael W. Phillips
*Attorney, Agent, or Firm*—Foley & Lardner

[57] ABSTRACT

A network control unit for monitoring and controlling all of the operational components of a facility management system, the unit including a modular base frame having a wiring board assembly mounted on the back, a number of termination board assemblies mounted on the front of the frame and being operably connected to the wiring board assembly, one or more function modules, digital control modules, expansion modules, and a network control module are mounted on the front of the frame and operably connected to the wiring board assembly.

50 Claims, 24 Drawing Sheets

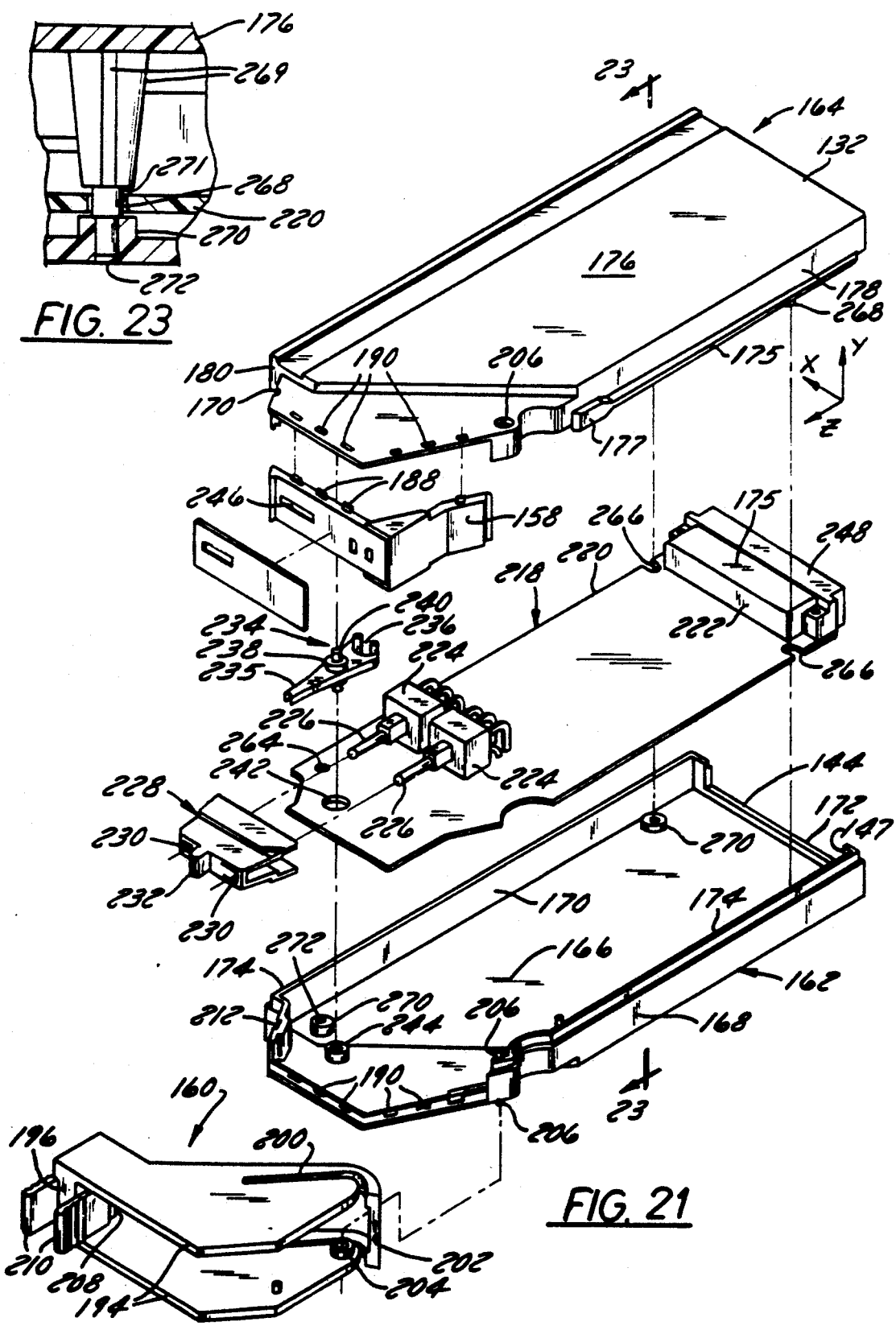

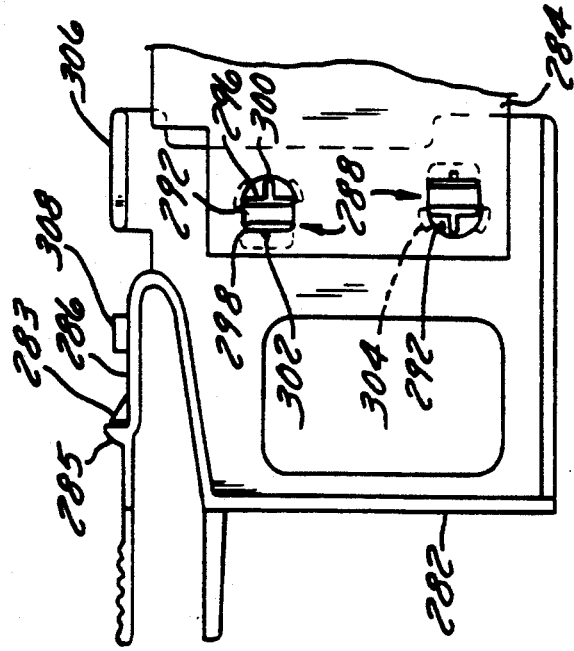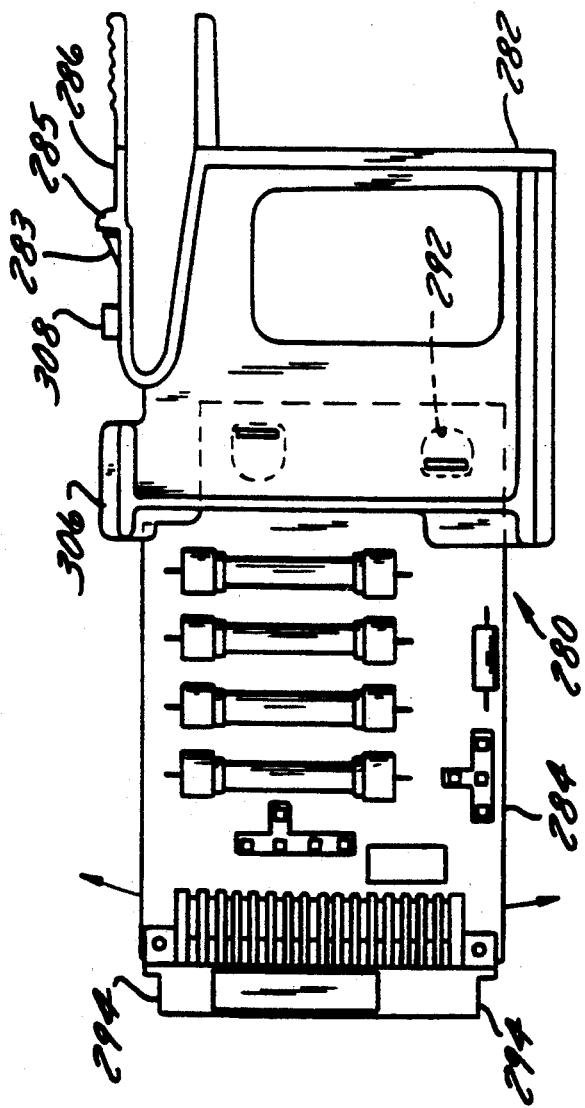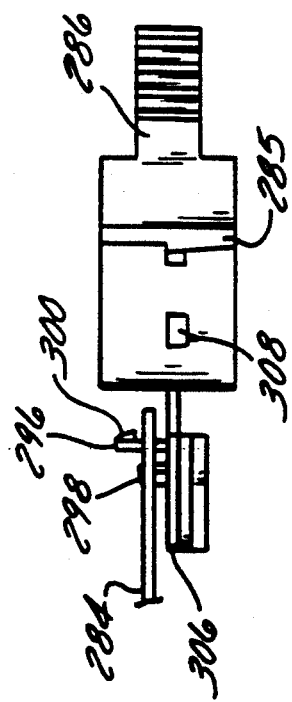

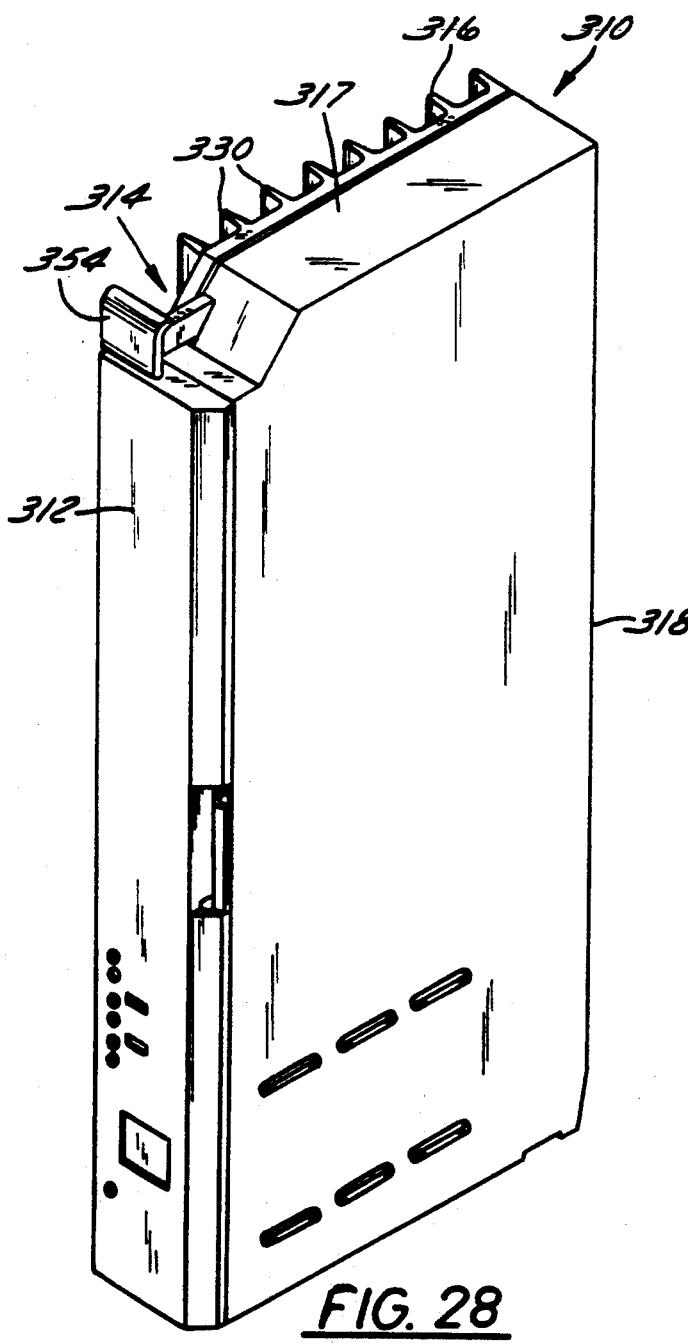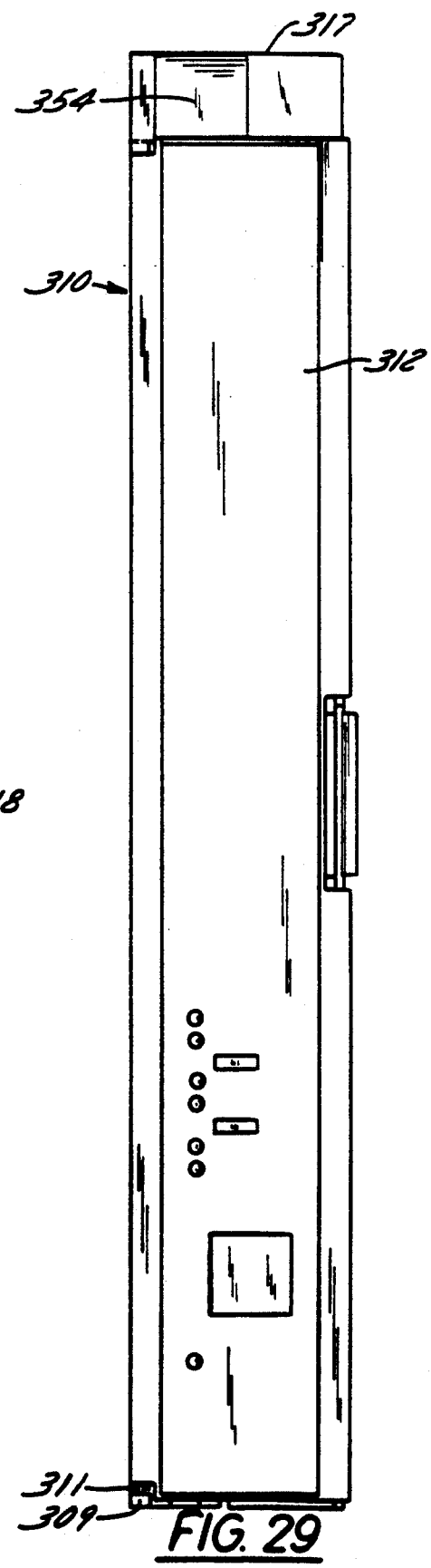
FIG. 28
FIG. 29

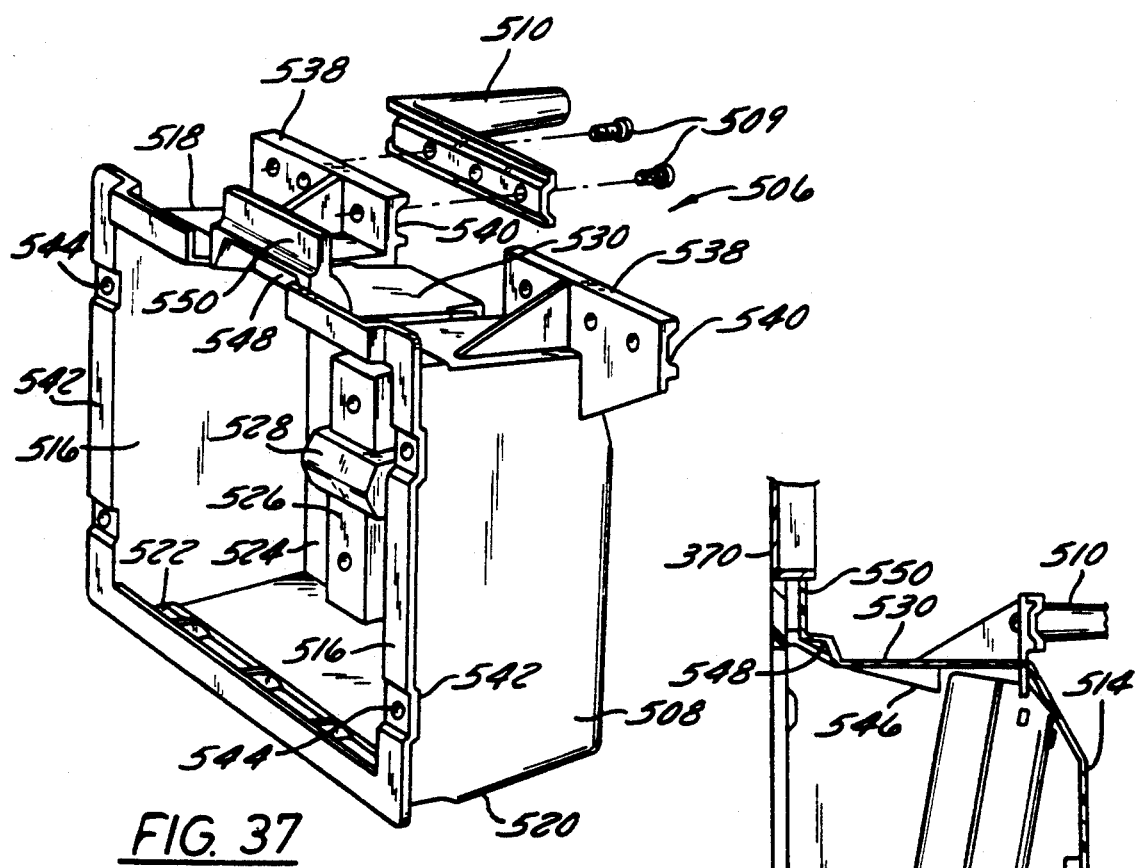
FIG. 37
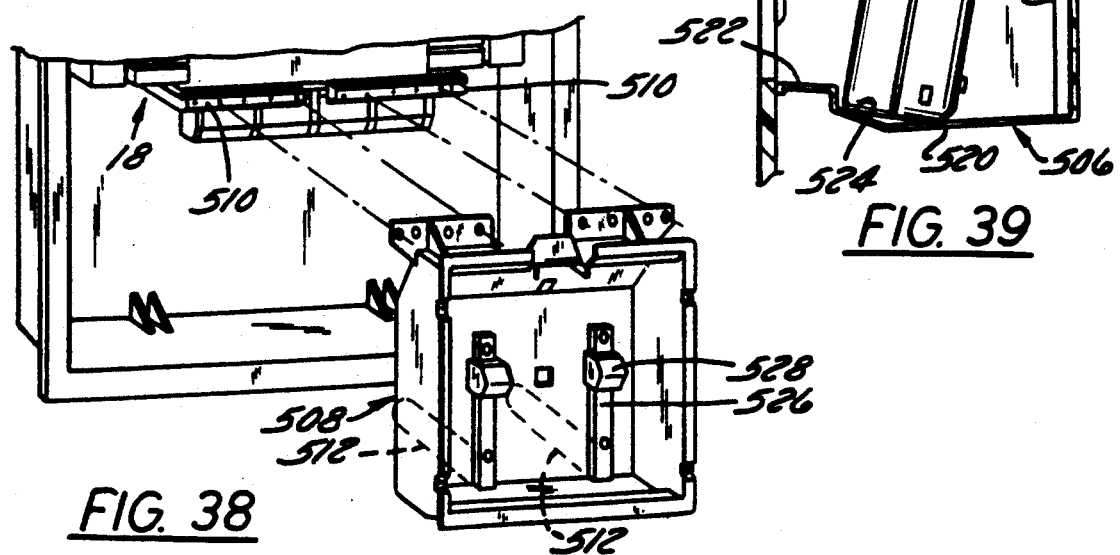
FIG. 38
FIG. 39

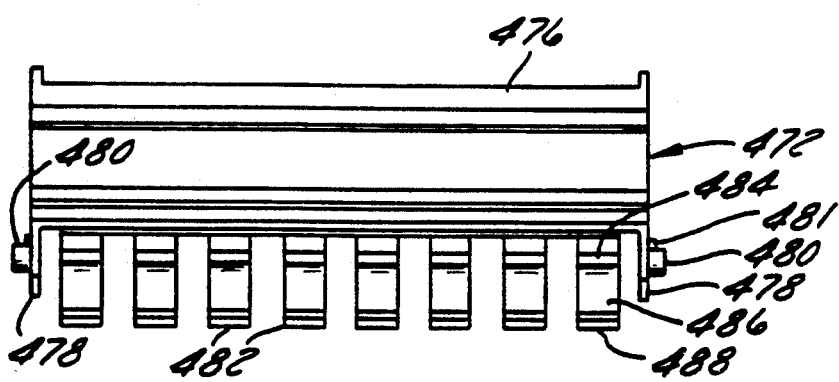
FIG. 40
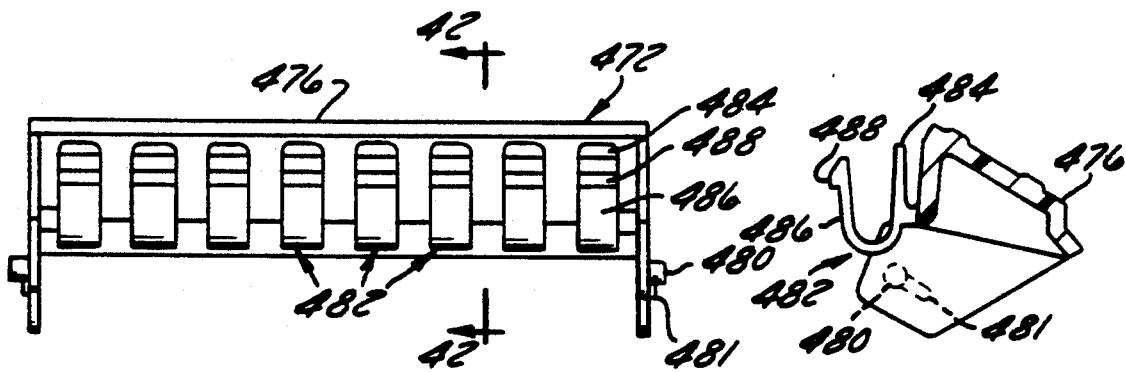
FIG. 41
FIG. 42
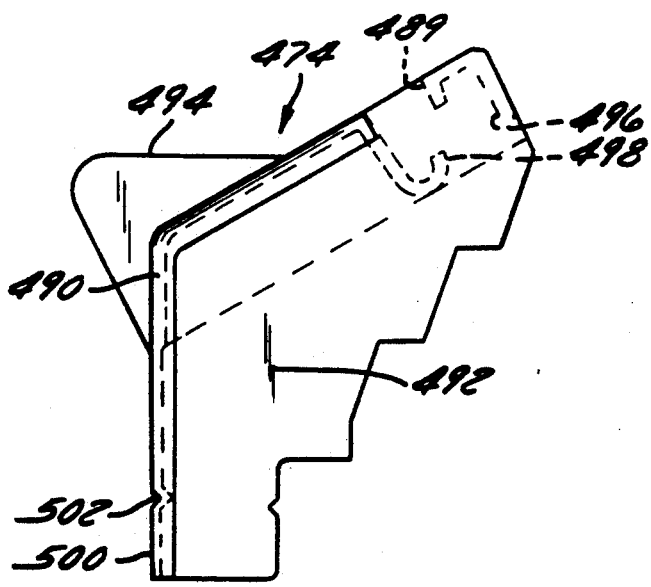
FIG. 43
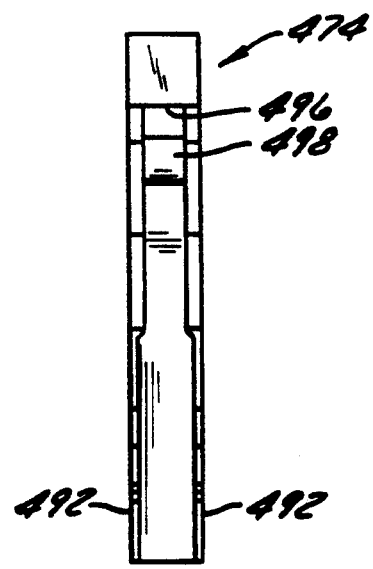
FIG. 44

ELECTRONIC/ELECTROMECHANICAL PACKAGING ARRANGEMENT FOR FACILITY MANAGEMENT SYSTEM

FIELD OF THE INVENTION

The present invention relates to a facility management system and more particularly to a network control unit which connects directly to field points to automatically control and optimize the heating, ventilating, air conditioning, lighting, fire, security and any other electromechanical building systems.

BACKGROUND OF THE INVENTION

Facility management systems presently available are characterized by the following: 1) general purpose programmable digital controllers, 2) discrete sensor/actuator interfaces, 3) communication interfaces, and 4) many different physical and logical interfaces. These systems require extensive customization for every installation. The system designer/installer must: develop and test application programs; define and construct multiple databases; design, build and install interface panels between digital controllers and the building's electrical/mechanical systems; train users on how standard features apply to specific needs of the facility; and develop maintenance and troubleshooting procedures for the customized portions of the system. All of these activities must be repeated every time a change to the building/network occurs.

Facility management systems presently available are constructed by the assembling of system components that include: controllers, communications interface devices, power supplies, interconnection devices, multiple enclosures, digital/electronic-to-electrical, electrical-to-digital/electronic, pneumatic-to-digital/electronic, digital/electronic-to-pneumatic control interface devices. Present installation configurations require custom engineering and design of facilities management systems utilizing system components that are characterized by nonstandard sizes, forms and installation methods. The performance characteristics of system components presently available require that these components be physically and electromagnetically separated by grouping them into two or more separate metallic enclosures. The installation of systems using presently available system components requires extensive engineering labor to design the multiple enclosure configurations and associated component-to-component interconnections. Extensive field-site labor is required to mount components, to interconnect components with discrete wiring and with cabling, and to verify that component-to-component connections are correct.

By applying new technologies it is possible to integrate all of the system components into a single nonmetallic enclosure, to standardize mounting methods, and to eliminate field-site component-to-component connections. This system component installation simplification results in an installation configuration with the following benefits: engineering and design labor savings; field-site labor savings; component organizational consistency providing ease of use and ease of service; increased system reliability due to reduction of component interconnections.

Another reason present system configurations utilize various form-factor system components that are custom engineered and mounted into multiple enclosures is the need to provide differing components according to the varied and unique need of each building/facility controls application. By utilizing a modular approach to the design of system components, thus required flexibility can be achieved by providing a variety of component types characterizing various performance capabilities where these component types are packaged into standardized module housings that are consistent with a modular mounting configuration. Thus, module types can be mixed and matched to satisfy each unique application requirement yet be mounted, used and serviced in a consistent manner.

SUMMARY OF THE PRESENT INVENTION

The present invention seeks to combine the available technologies and thereby redefine the facility management system. The system as described herein provides a modular family of control system components that are designed and manufactured utilizing a family of mechanical and electromechanical parts. This modular family of system components is characterized by type variety for application flexibility, by mounting consistency, by user consistency, by serviceability consistency, by compactness, by overall organizational appeal, and by ease of installation, use and service. A single enclosure-contained panel of system component modules provides all of the control loop and monitoring functions (controller, power, connection, physical interfaces) required for a facility controls application.

The principal advantages of the present invention are:
single-enclosure containment of all control and monitoring functions for a facility management system to include: power supplies, communications, digital and analog controllers, network control, input/output (i/o), point expansion, electronics/electrical to pneumatic (e-t-p), and pneumatic to electrical/electronic (p-t-e), sensing and control, analog/digital sensing and line voltage sensing and switching, current loop sourcing and sensing, direct field connections;
compactness: high density of enclosed functions, achieved by modular integration and elimination of intercomponent in-the-field connections;
organizational consistency and simplicity-human factors and design;
enhanced field installation reliability by dramatic reduction of the number of field installation operations;
modular system components: ease of installation; ease of source troubleshooting and replacement, ease of use, flexible configurations;
reduced: engineering and design labor, installation labor, service labor, user labor/time;
integration of standard auto/manual override;
no tool required module installation and replacement.

A principal feature of the invention is the provision of a single base frame assembly for supporting all of the various components required to control a facility.

Another feature of the invention is the use of plug-in type modules for all of the control functions in the base frame assembly.

Another advantage of the plug-in modules is the provision for self centering of the electrical connectors of the modules with the wiring board connectors when plugged into the main wiring board assembly.

Another feature of the invention is the provision of a modularized Faraday shield in a base frame assembly which extends to all associated equipment as it is connected to the assembly.

Another feature of the present invention is the ability to mount the base frame assembly on a wall as an independent unit or in an enclosure.

Another advantage of the present invention is the provision of a base frame assembly in a variety of configurations to accommodate a variety of management system requirements. The base frame assembly may be directly wall mounted in a nonenclosed fashion, mounted in nonspecific "third party" enclosures, or mounted on customer/specific enclosures. Enclosure mounting provides containment of connecting cabling, wire, and tube, and for securing of contained controlling devices/equipment.

Other principal features and advantages of the invention will become apparent to those skilled in the art upon review of the following drawings, the detailed description and the appended claims.

DETAILED DESCRIPTION OF THE DRAWINGS

FIG. 21 is an exploded perspective view of the function module.

FIG. 23 is a cross-sectional view of one of the mounting pin assemblies for joining the sections of the function module casing.

FIG. 24 is a view of the component side of a universal function module.

FIG. 25 is a view of the noncomponent side of the bracket portion of the module shown in FIG. 24.

FIG. 26 is an end view of the head bracket of the module shown in FIG. 24.

FIG. 27 is an exploded perspective view of the mounting assembly for connecting the wiring board to the head bracket of the universal function module.

FIG. 28 is a perspective view of one of the control modules.

FIG. 29 is a front elevation view of the control module.

FIG. 37 is a perspective view of the network terminal cradle.

FIG. 38 is an exploded perspective view of the cradle supported on the frame 18.

FIG. 39 is a side view of the cradle showing the network terminal locked in the cradle.

FIG. 40 is a front view of the wire barrier frame.

FIG. 41 is a top view of the wire barrier frame.

FIG. 42 is a view taken on line 42-42 of FIG. 41.

FIG. 43 is a side view of the wire barrier boot.

FIG. 44 is a front view of the wire barrier boot.

Figure 1:
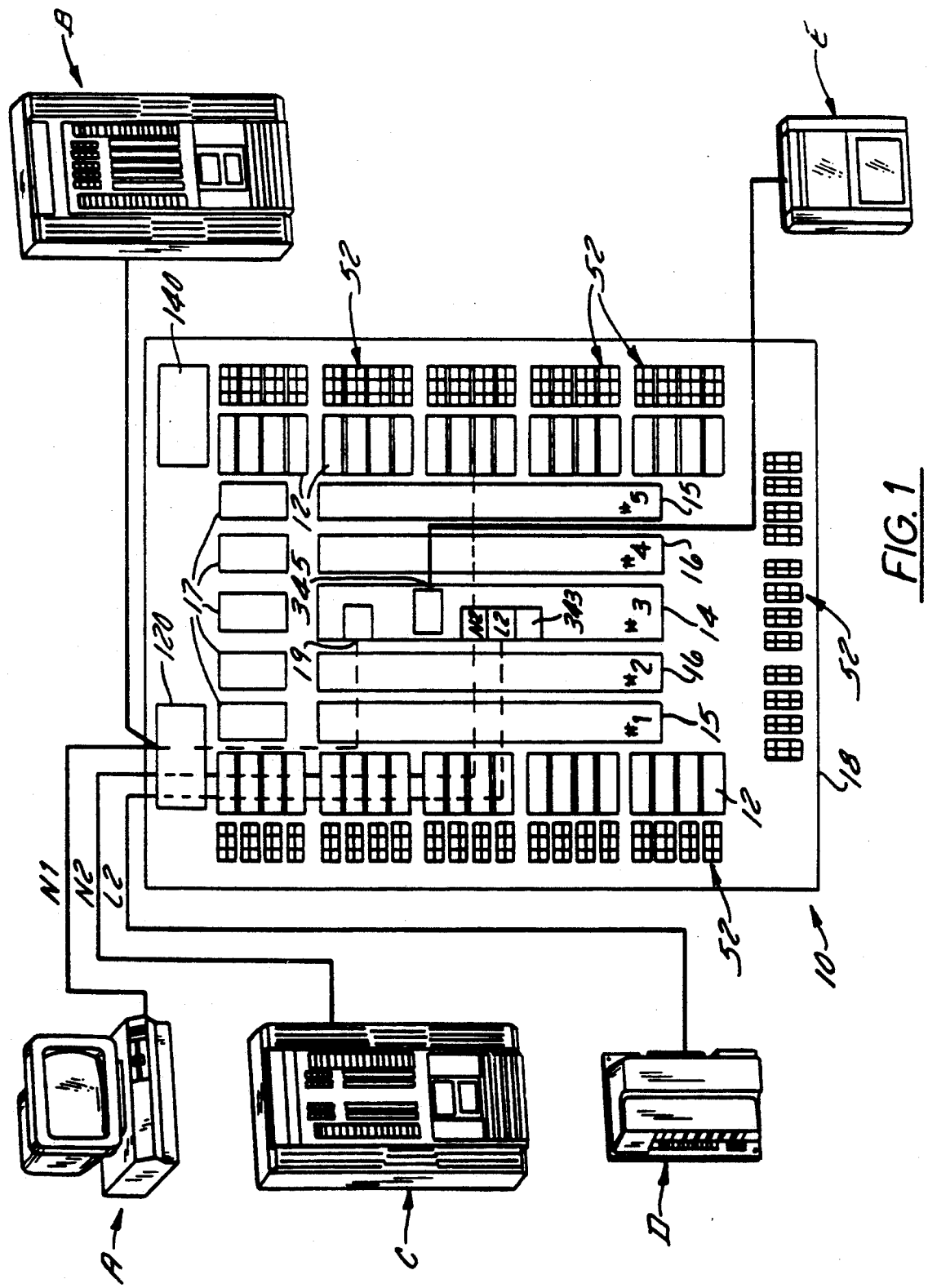
FIG. 1 is a view of the network control unit shown connected to the various function members and components of a facility management system.
Figure 2:
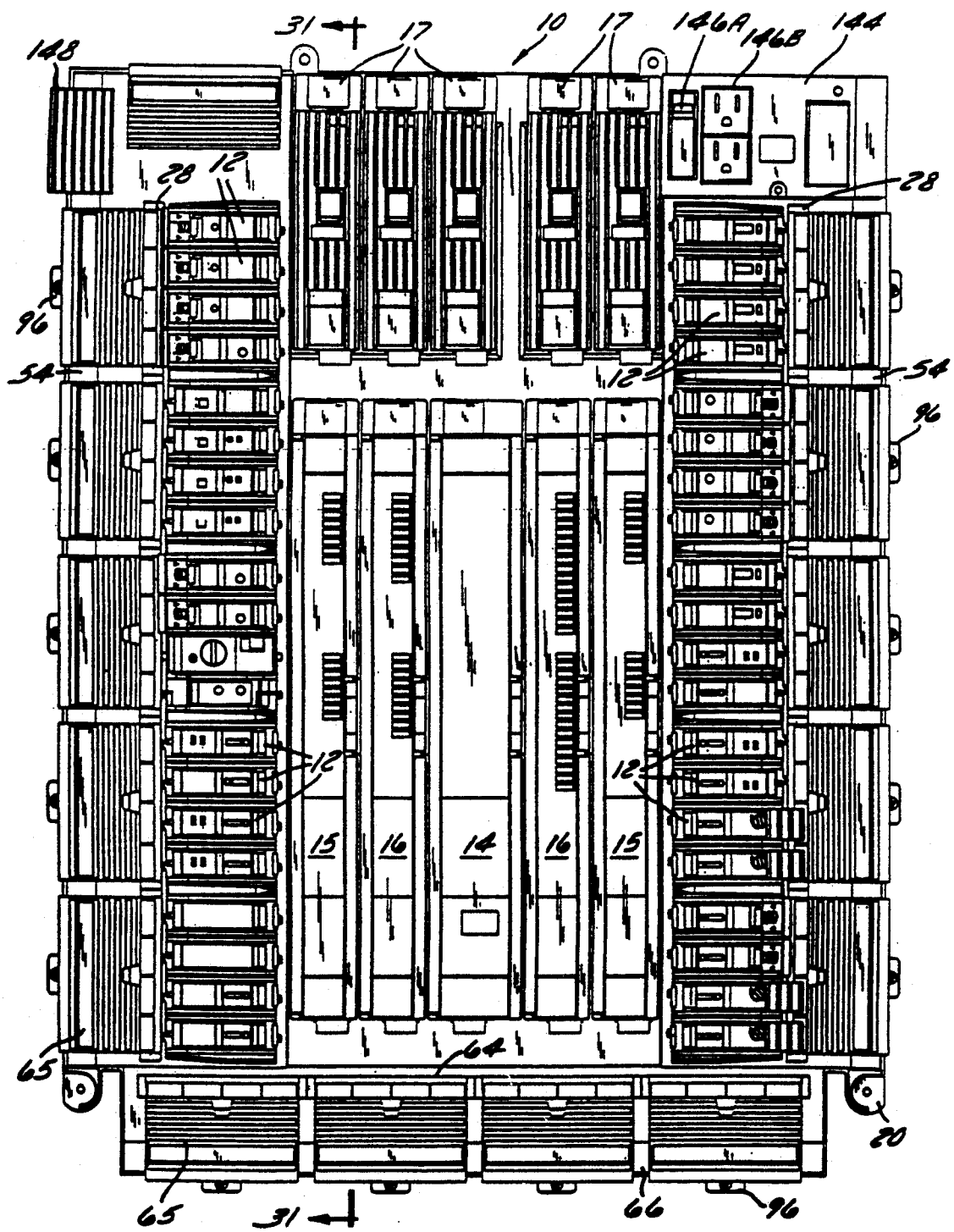
FIG. 2 is a front elevation view of the network control unit according to the present invention.
Figures 3, 4:
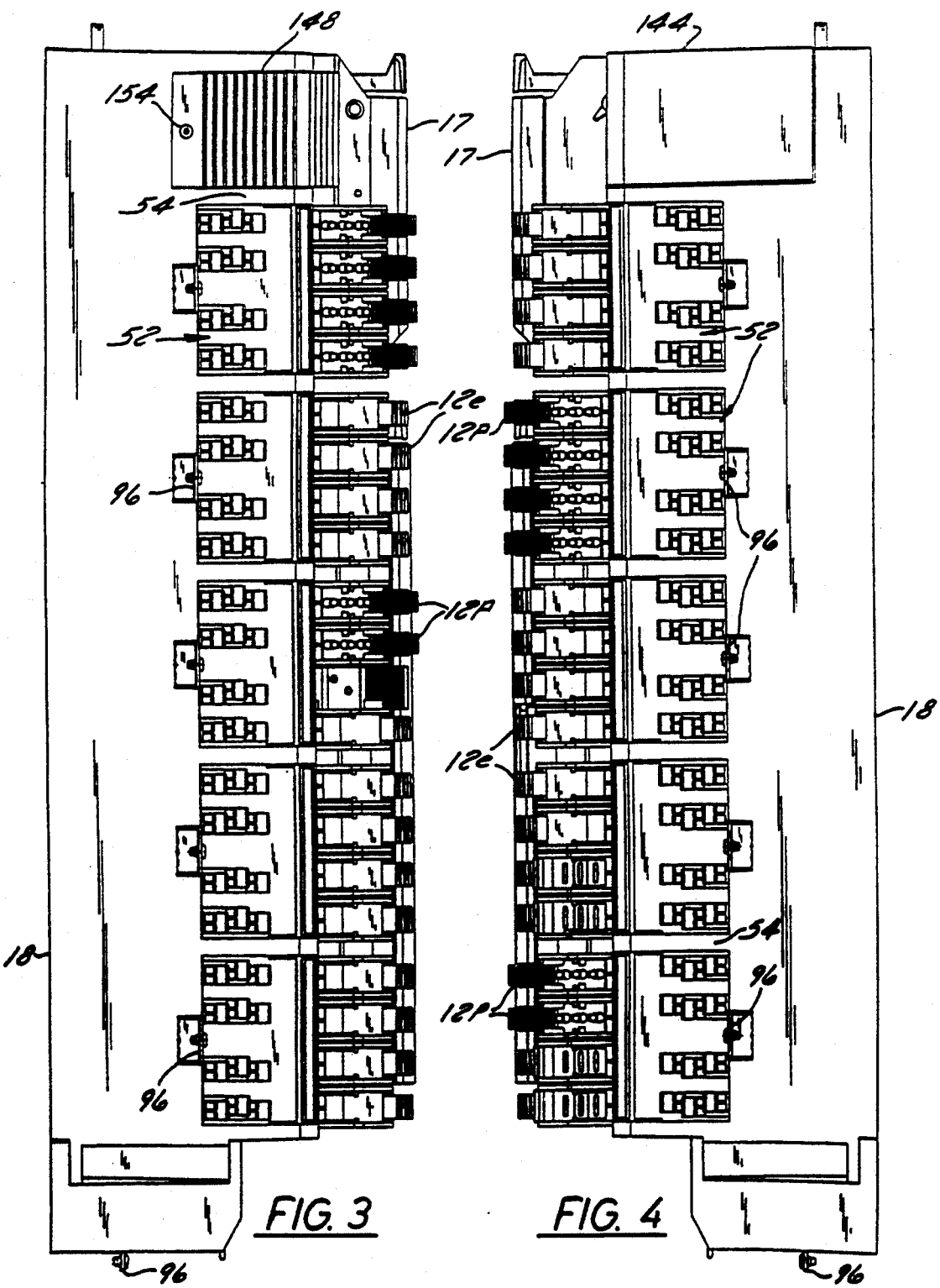
FIG. 3 is a left side view of the control unit of FIG. 2.
FIG. 4 is a right side view of the control unit of FIG. 2.
Figure 6:
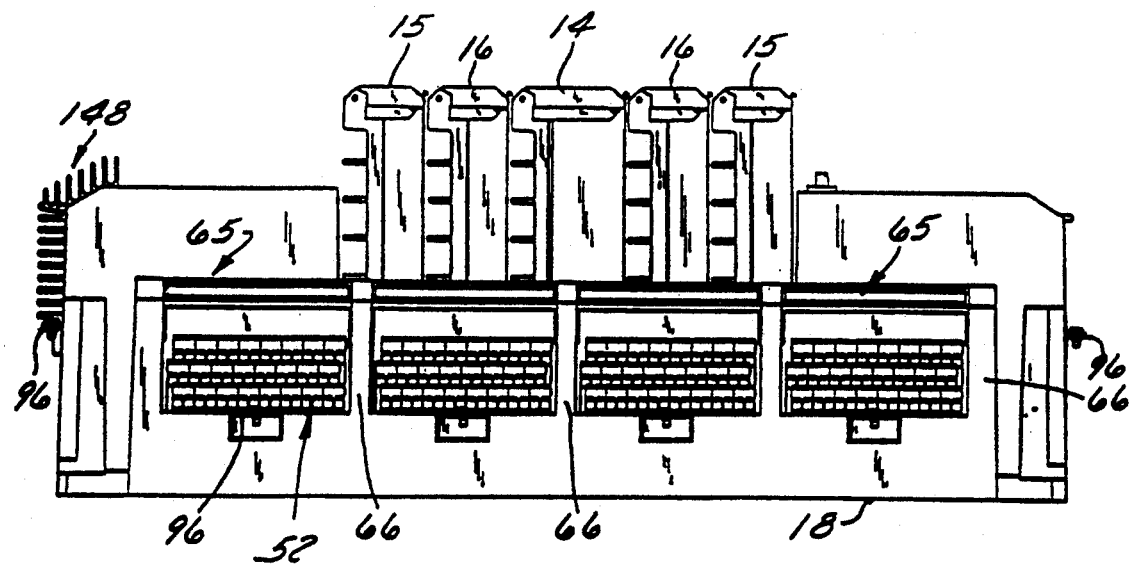
FIG. 6 is a bottom view of the control unit of FIG. 2.
Figure 5:
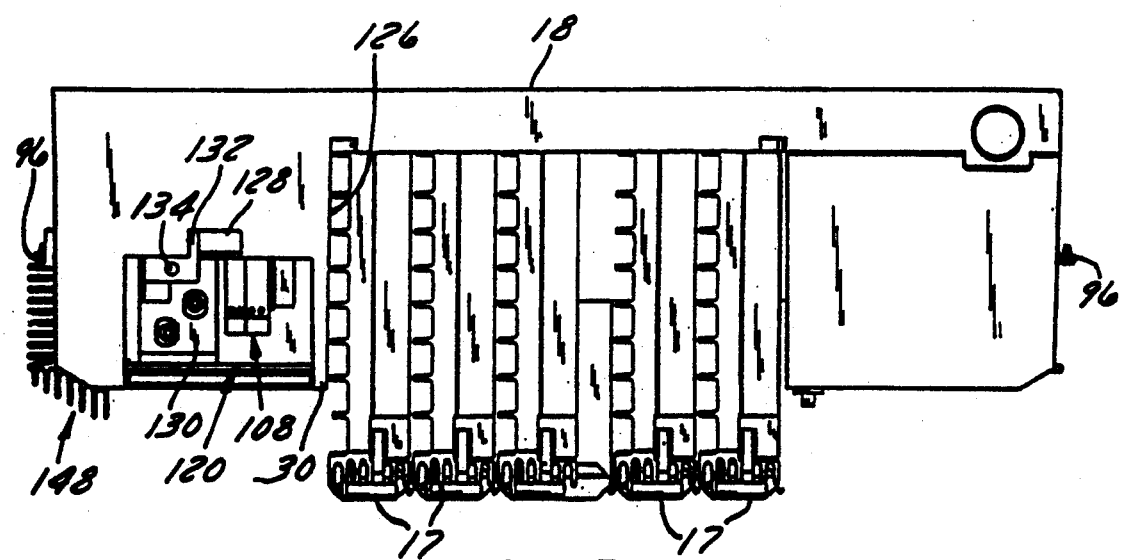
FIG. 5 is a top view of the control unit of FIG. 2.

Before explaining at least one embodiment of the invention in detail it is to be understood that the invention is not limited in its application to the details of construction and the arrangement of the components set forth in the following description or illustrated in the drawings. The invention is capable of other embodiments or being practiced or carried out in various ways. Also, it is to be understood that the phraseology and terminology employed herein is for the purposes of description and should not be regarded as limiting.

DETAILED DESCRIPTION OF THE PREFERRED EMBODIMENTS

A facility management system of the type contemplated herein is described in U.S. patent application Ser. No. 07/476,031 filed on Jan. 30, 1990, entitled "Network Facilities/Management System," assigned to the same assignee, the disclosure of which is incorporated herein by reference.

The network control unit (NCU) is a field panel housing electronic modules, terminal blocks and signal conditioners (pneumatic, line voltage, and electronic) all located inside a single enclosure. Referring to FIG. 1 the network control unit 10 according to the invention is shown connected to the various network communication Buses N1, N2 and L2 which are used to control the facility management system. The network control unit generally includes a base frame 18 which includes a one-, two- or five-slot type base frame or chassis 18. The base frame or chassis 18 provides the physical connection between the network communication Buses N1, N2 and L2, the external power and the field wiring to the main printed wiring board assembly FIG. 9, 20 mounted on the back of the base frame 18.

A five-slot configured base frame 18 is illustrated in FIG. 1 which includes a number of termination board assemblies 52. A number of function modules 12 are mounted along each edge of the base frame 18, and a network control module 14 may be mounted in the center of the base frame. Digital control modules 15 and expansion modules 16 are mounted on each side of the network control module 14. A power module 17 is provided for each of the control modules 14, 15, 16

The network control module 14 can be mounted in a five-slot configured base frame in slots 1, 3 or 4 (never in 2 or 5); if plugged into slot 1, slot 2 is rendered unavailable for use; if plugged into slot 4, slot 5 is rendered unavailable; slot 3 is used exclusively for network control module 14. The digital control module 15 can be plugged into slots 1 and/or 5. The expansion modules 16 can be plugged into slot 1 and/or 2, 4, or 5, independently.

As noted in the drawing, FIG. 1, the N1 Bus is connected to an operator workstation A or to another network control unit B through a communication termination board assembly 120. The N2 Bus is connected to a submodule N2 in the network control module 14 which is terminated with field wiring at a communication termination board 120. The module 14 can also be connected to a network expansion unit (NEU) C or another N2 connectivity device. The L2 Bus is connected to a submodule L2 in the network control module 14 a via communication termination board assembly 120 to another controller D. External line voltage is brought into a power termination assembly 140 as a primary source of power for NEU/NCU devices which is routed through the main printed wiring board assembly 20 to the individual power supply modules 17. A network terminal E is also shown connected to the network terminal jack 345 in the network control unit 14.

Figure 8:
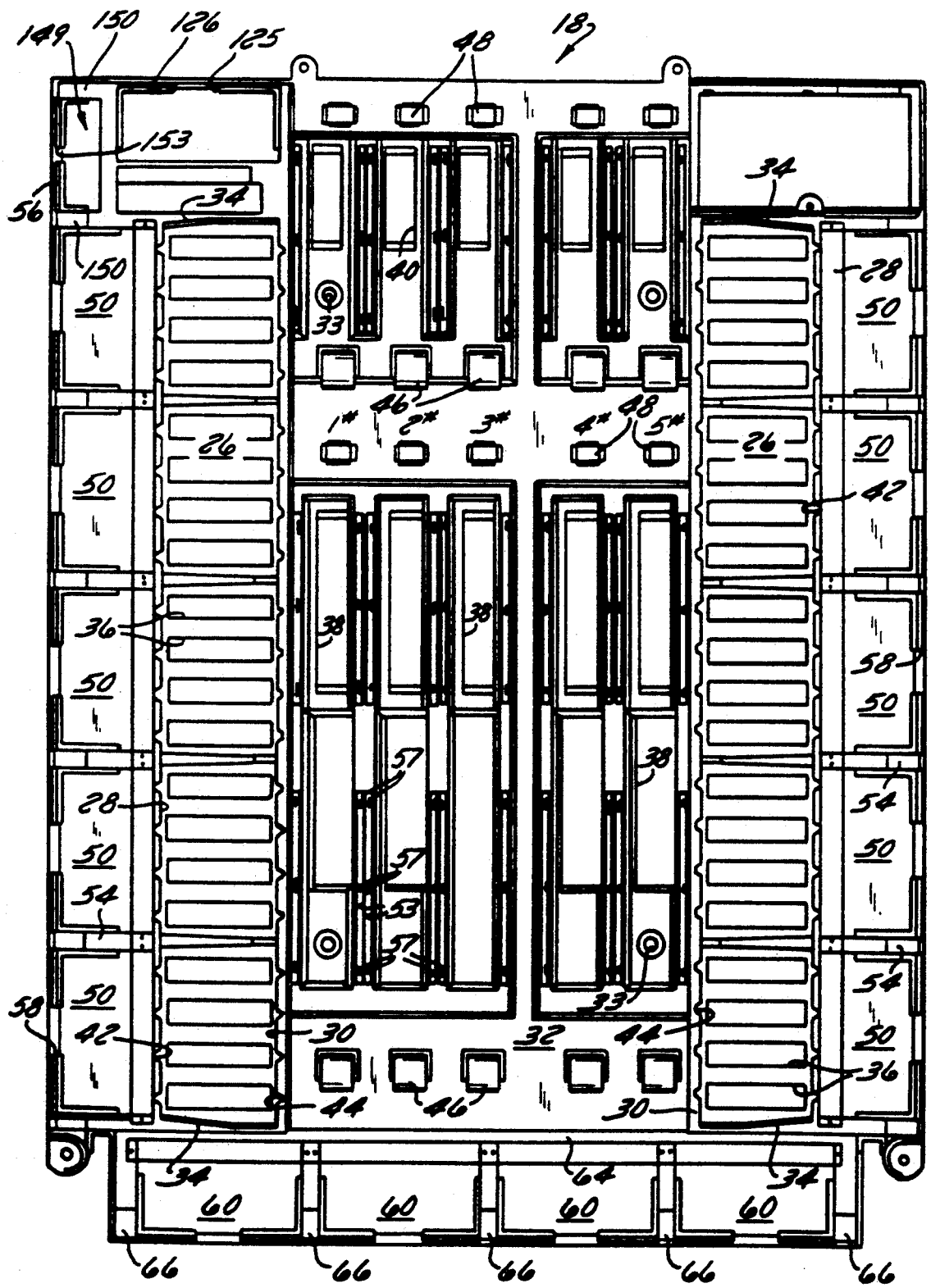
FIG. 8 is a front elevation view of the main frame or chassis.
Figure 9:
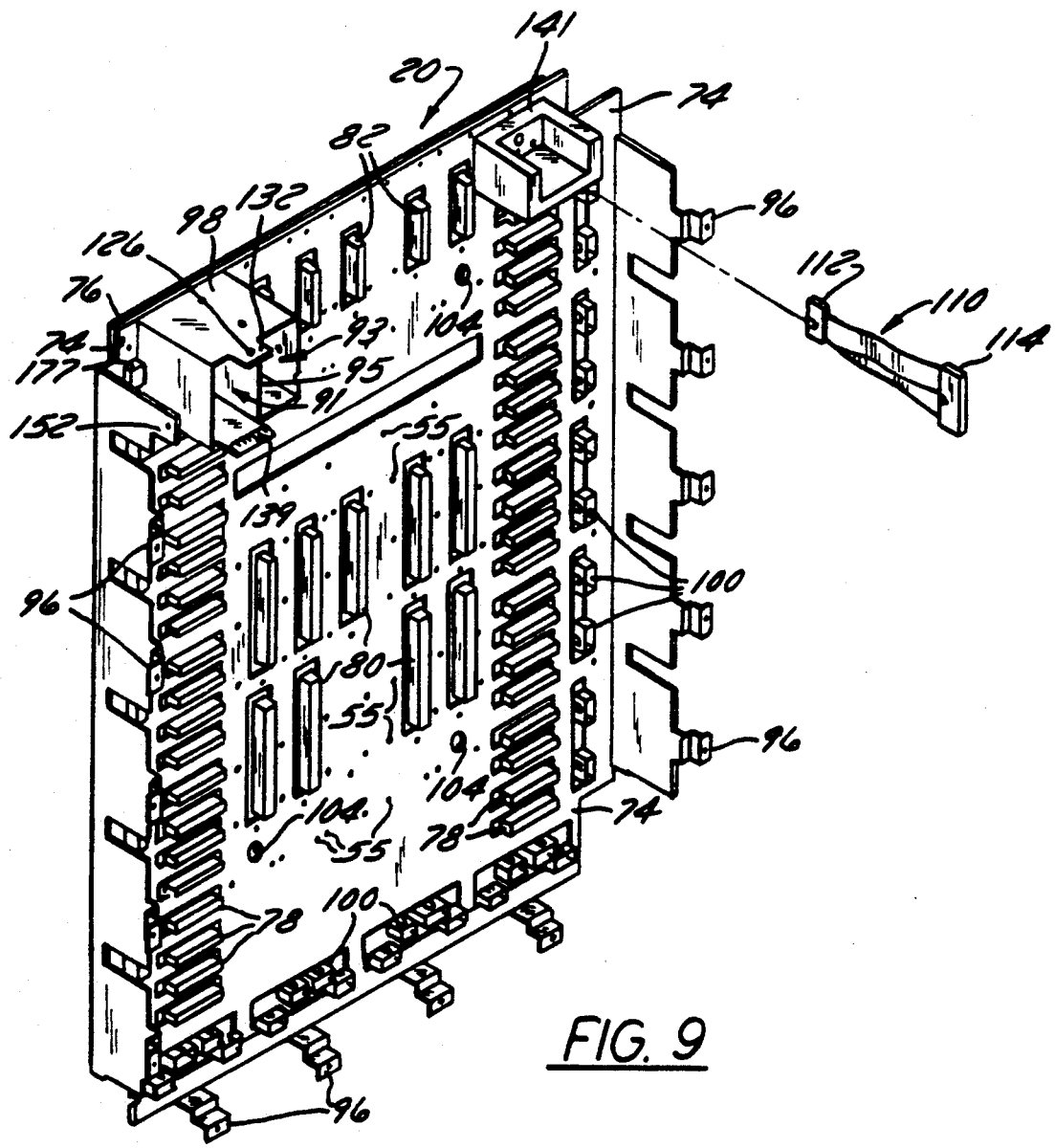
FIG. 9 is a perspective view of the main printed wiring board assembly.

More specifically, the network control unit 10 (NCU) as shown in FIGS. 2-6, includes a number of function modules 12, a network control module 14, digital control modules 15, expansion modules 16 and power modules 17 mounted on the base frame 18 and electrically interconnected by means of the main printed wiring board or motherboard assembly 20, FIG. 9, which is mounted on the back of the base frame 18, FIG. 8. These modules can be combined in various configurations for a variety of systems as noted above. The network control unit 10 monitors and supervises the heating, ventilating and air conditioning systems, as well as the lighting, fire, security and various other building functions.

The network control module 14 is the main processor in the NCU and is fully user programmable. It performs supervisory control of all hard wired points and control loops as well as remote activities in specified areas of a building. Thus in accordance with specialized programs the network control module 14 supervises and maintains environmental conditions according to program parameters and communicates with operational units such as digital control modules, expansion modules, and other N2 connectivity devices connected to the network control modules.

The digital control modules 15 generally include a processor and memory. The digital control modules condition sensor inputs and reports changes to the network control module 14. The digital control modules 15 perform closed loop control for up to eight control loops. Thus, closed loop control can be accomplished without a network control module. The digital control module can also accept inputs indirectly via N2 connectivity or directly through the function modules 12.

The expansion modules 16 also include a processor and memory. Expansion modules condition analog and digital inputs and report changes to the network control module 14. In addition the expansion module 16 executes binary output commands from the network control module 14.

The power modules 17 convert incoming line voltage into isolated and regulated conventional lower voltages for use with solid-state modules 14, 15 and 16 and its sensors, transducers, and relays. Power can be interrupted for one module on the network control unit while leaving the others operational. The power modules are equipped with an integral switch and status LEDS.

The function modules 12 interface sensing input signals and control line output signals to the digital control modules 16. The function modules 12 are tailored to accommodate the specific conditioning function required. Thus, a function module 12 may contain sophisticated electronics tailored to perform a specific task or may be as simple as a single resistor. Typical input function modules 12 in the system include pressure/electric transducers, binary input contacts or AC line voltage conditioners, differential pressure inputs and binary frequency inputs. Typical output function modules 12 include analog outputs, analog outputs with isolated grounds, electric/pressure transducers, binary polarity reversing, triac incremental function modules, motor starts/motor stop function modules, electrically maintained relay outputs, magnetically latched relay outputs, and solenoid air valve function modules.

Figure 33:
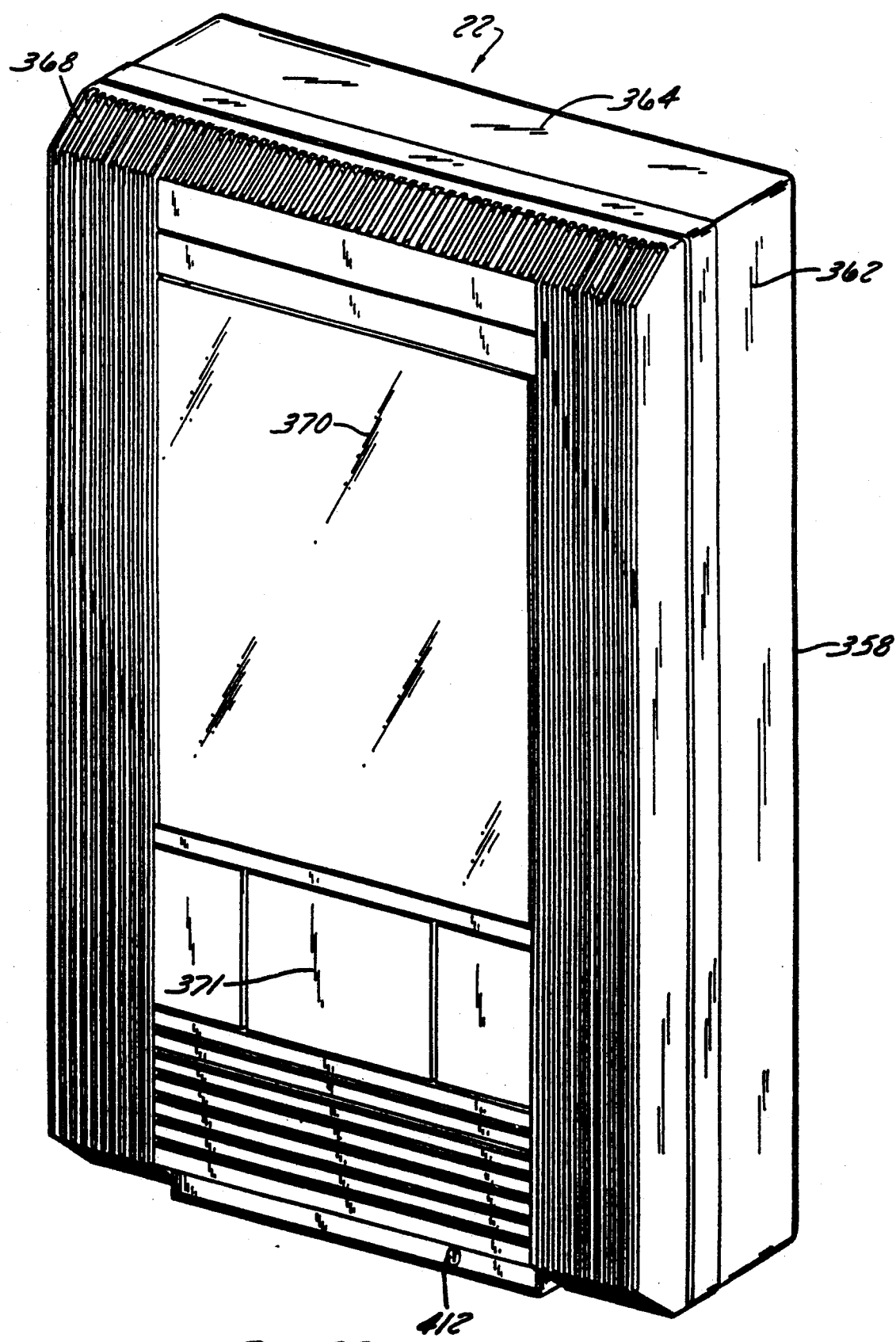
FIG. 33 is a perspective view of the enclosure for the network control module.
Figure 34:
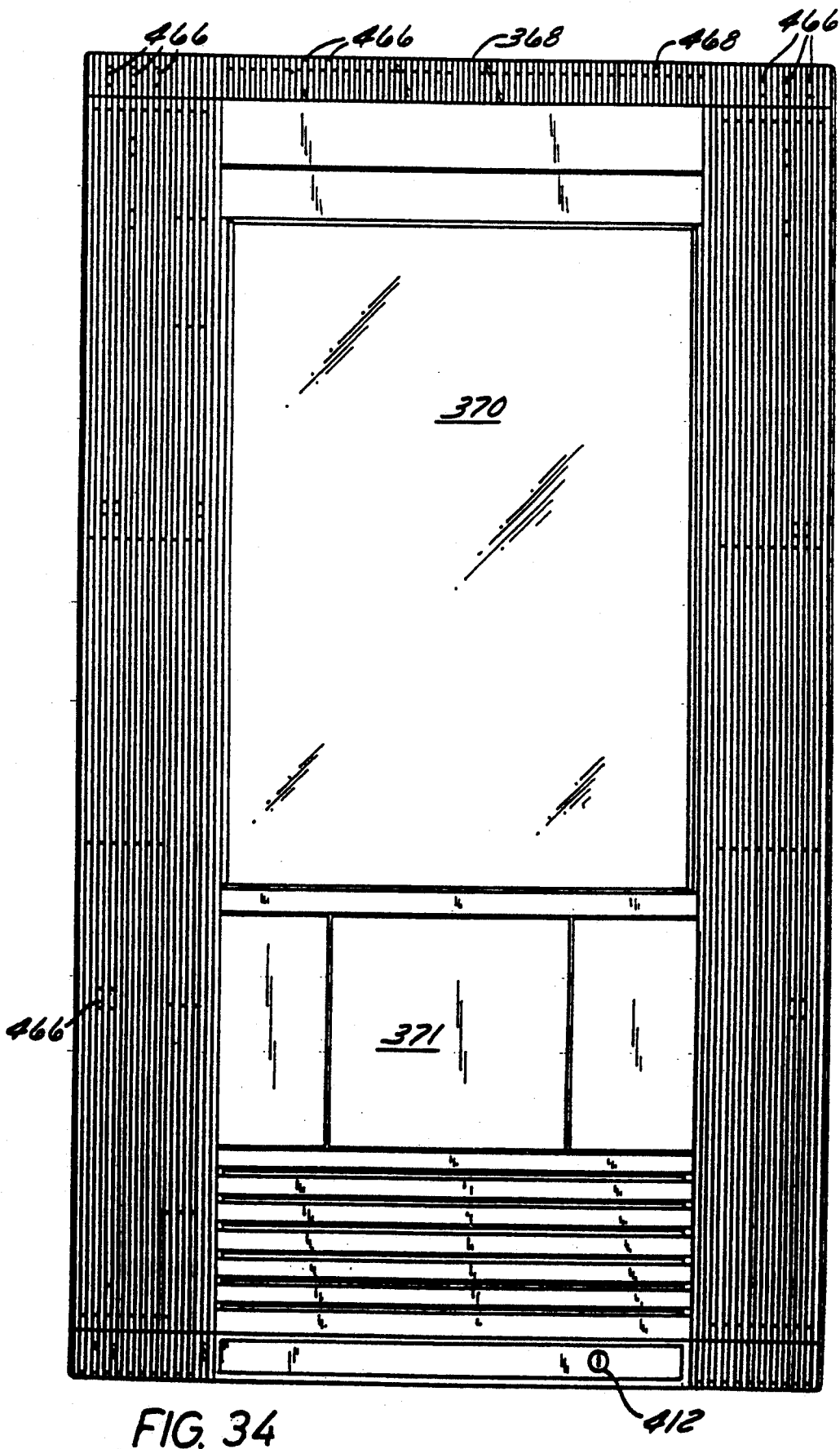
FIG. 34 is a front elevation view of the enclosure.
Figure 35:
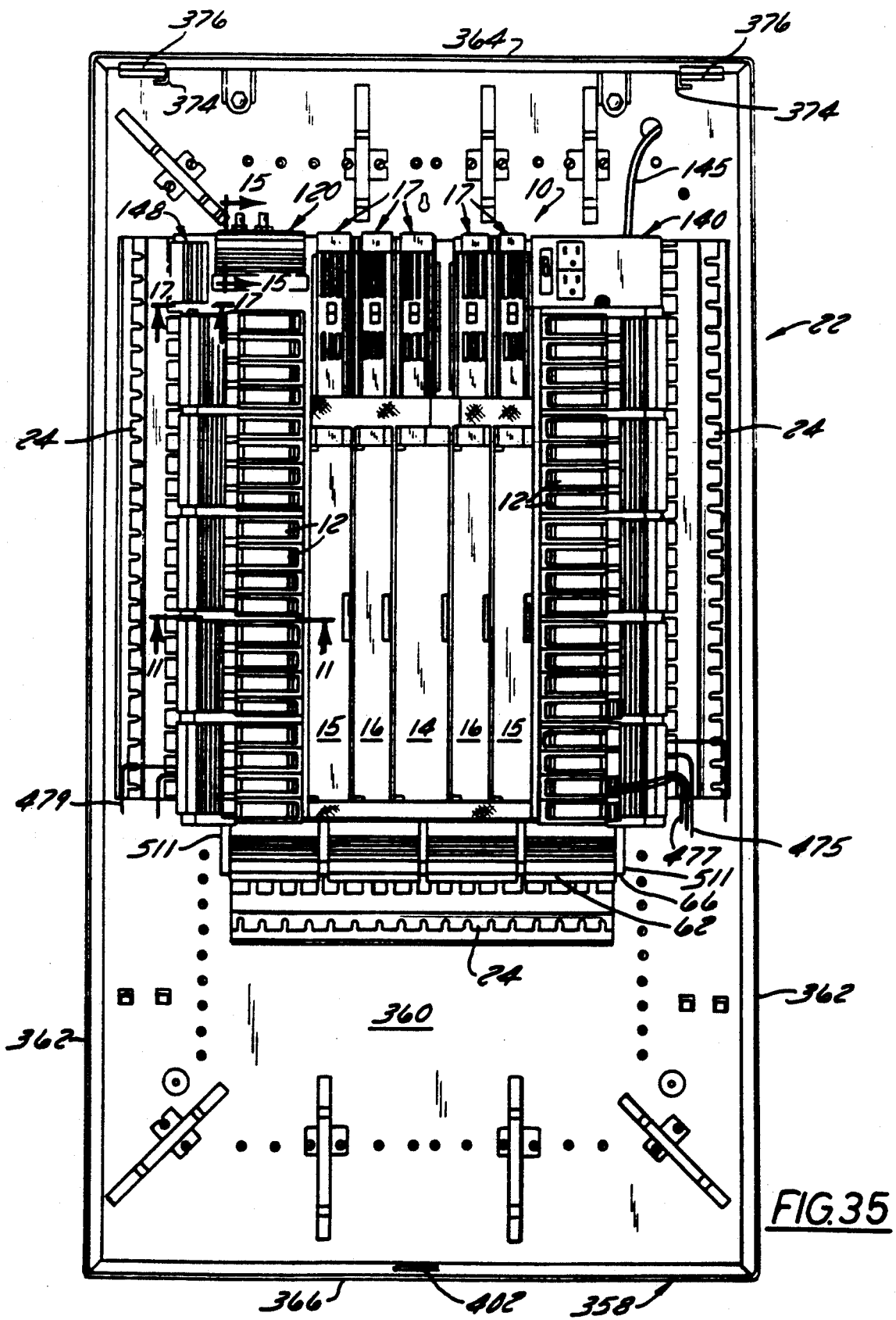
FIG. 35 is a view of the enclosure with the cover removed showing the network control unit.
Figure 36:
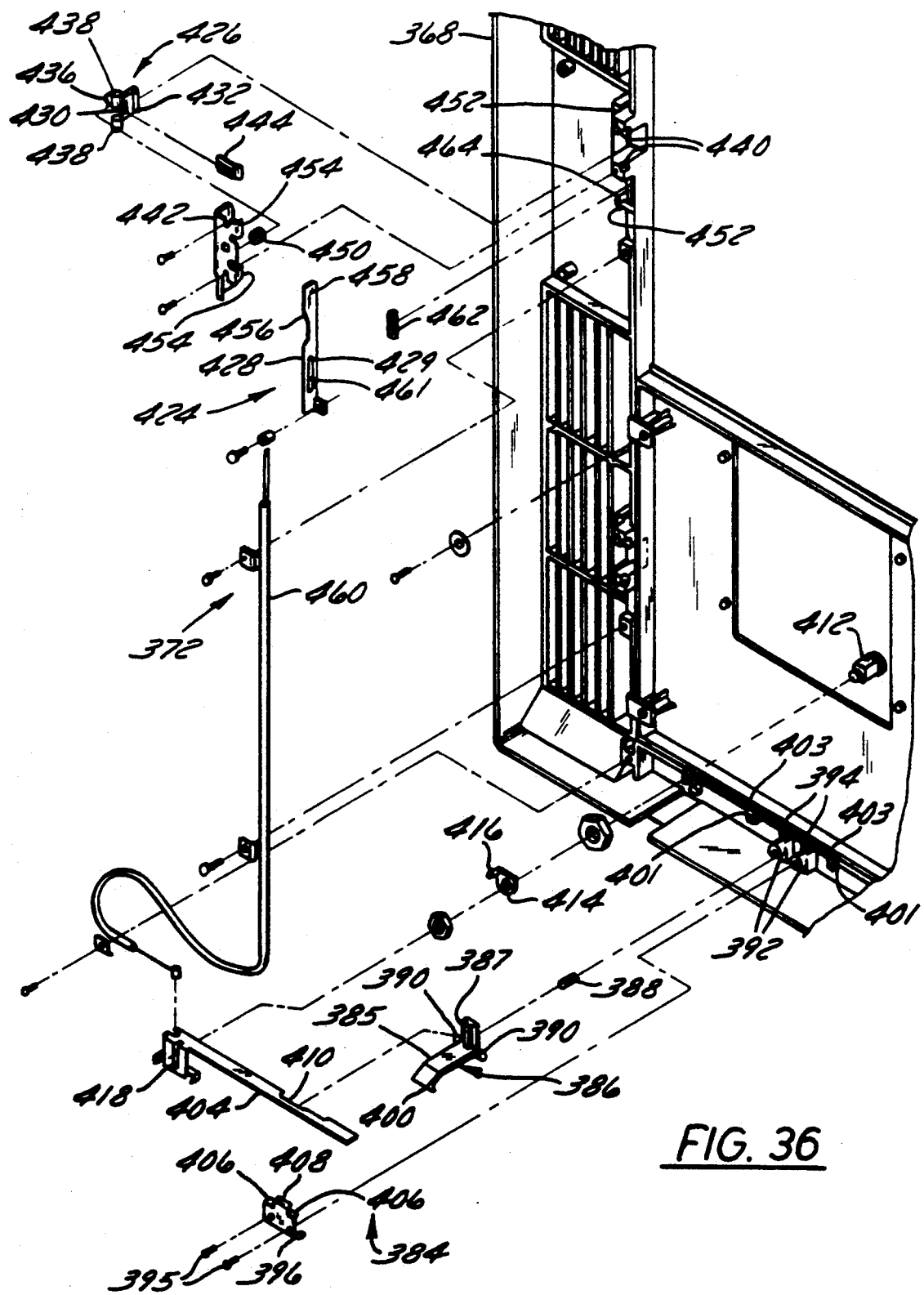
FIG. 36 is an exploded perspective view of the key lock assembly for the enclosure cover and door.
Figure 45:
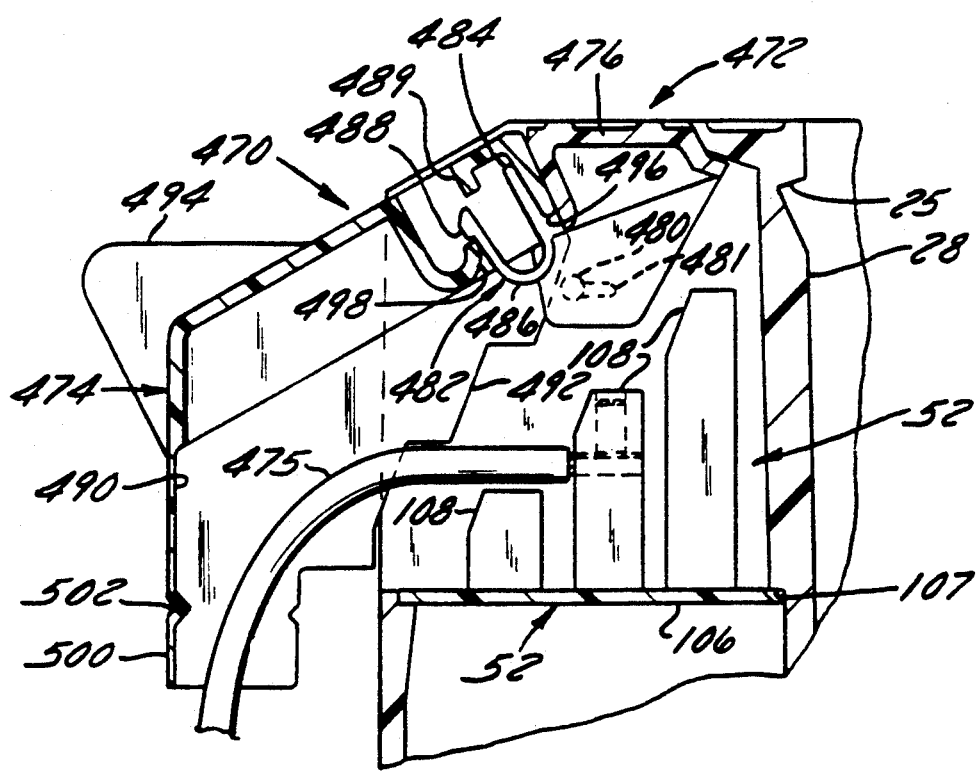
FIG. 45 is a side view of the boot shown mounted on the frame.

The network control unit 10 according to the invention can be mounted in an enclosure 22 as seen in FIGS. 33, 34 and 35 or directly on a wall as desired. Wiring ducts 24, such as shown and described in co-pending application Ser. No. 07/306,772 entitled "Device for Wiring Duct Work," filed on Sep. 13, 1989, assigned to the same assignee and incorporated herein by reference, are mounted in the enclosure 22, FIG. 35, for routing the line voltage wires 475, low voltage wires 479 and pneumatic tubes 477 to the termination board assemblies 52 on the base frame 18. Wire guides 472, 470, FIGS. 40-45 are provided for separating the line voltage wires 475 from the low voltage wires 479 and pneumatic tubes 477.

The network control unit 10, as noted above, is characterized by a base frame 18 with a configuration of control module types, one of which must be a network control module 14, and optionally a function module 12. The configured base frame 18 may be enclosure contained or be open frame and direct wall mounted. The unit 10 consists of the base frame or chassis 18, a main printed wiring board assembly 20, a number of field termination board assemblies 52, a communication termination board assembly 120, and a power termination assembly 140. The base frame 18, when configured with various function modules 12, control modules 15 and 16 and a network control module 14 comprise a Network Control Unit (NCU). A base frame 18 configured with various modules, none of which is a network control module, comprises a Network Expansion Unit (NEU).

Base Frame

Figure 7:
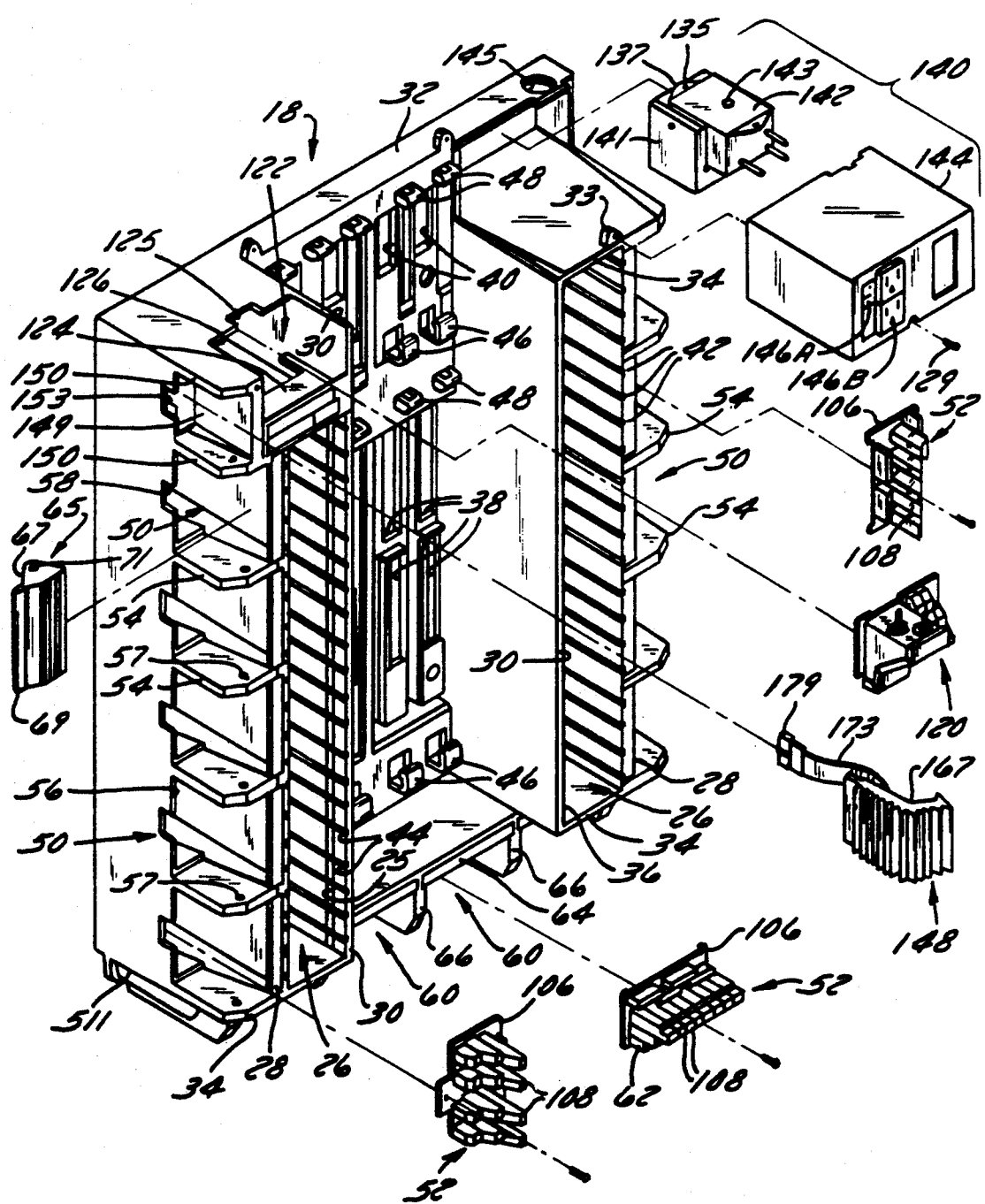
FIG. 7 is an exploded perspective view of the main frame or chassis showing various components of the network control unit.

The base frame or chassis 18, as shown in FIGS. 7 and 8, is a single monolithic low pressure structural engineering grade polymeric grade resin molded structure. The main printed wiring boar assembly 20 FIG. 9 field termination board assembly 52, communication termination board assembly 120, and power termination 140 are attached to the base frame by means of self tapping/threading screws or machine screws into sonically inserted brass heads. The field termination board assemblies 52 and communication termination board assembly 120 are circuit connected to the main printed wiring board assembly. The power termination assembly is circuit connected to the main printed wiring board assembly by discrete wires.

In this regard and referring to FIG. 8, the base or frame 18 includes a base chassis 32 having a function module cage 26 on each side of the base 32. The cages 26 are formed by an outer wall 28 and an inner wall 30 which are integral parts of the base 32. An end wall 34 is provided at each end of the walls 28 and 30. A first set of function module slots 36 are provided in the base 32 in a parallel spaced relation between walls 28 and 30. A second set of control module slots 38 are provided between the cages 26. A third set of power module slots 40 are provided on the upper portion of the base 32 in alignment with slots 38.

Figure 18:
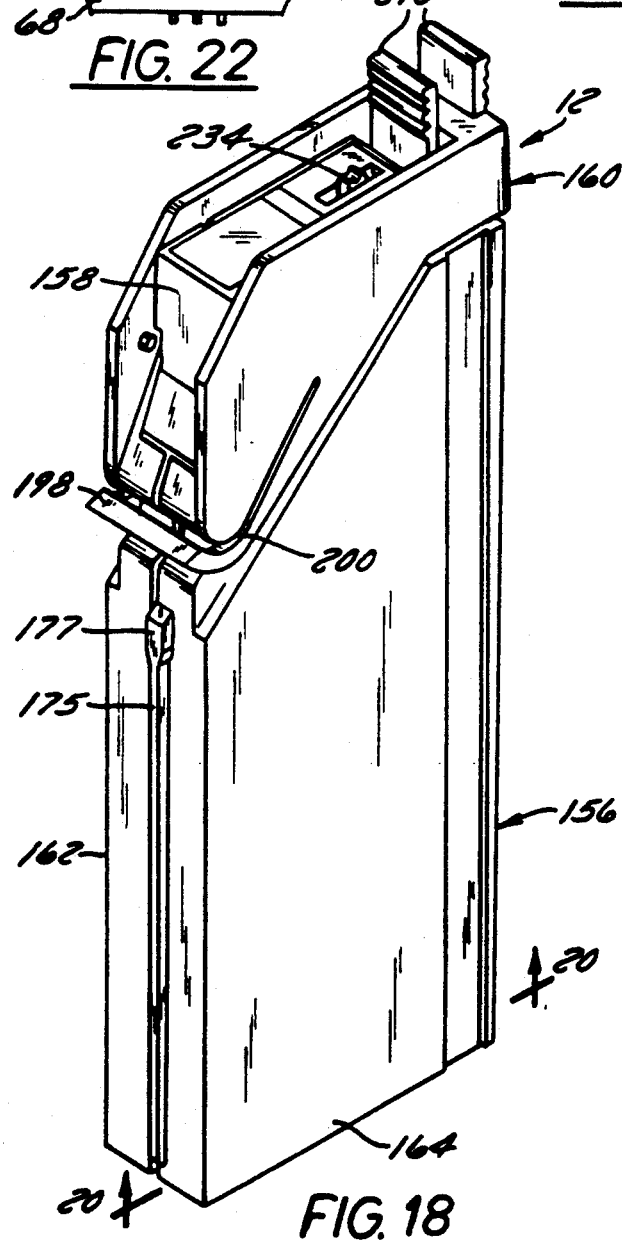
FIG. 18 is a perspective view of one of the function modules.

Means are provided in the surfaces of the walls 28 and 30 for guiding the function modules 12 into engagement with the slots 36 in the base 32. Such means is in the form of tapered grooves 42 and 44 provided in walls 28 and 30, respectively, which are aligned with the slots 36. It should be noted that each of the slots 42 and 44 are tapered inwardly from top to bottom. Means are provided in each cage for securing the function modules 12 in the cage 26. Such means is in the form of a groove or recess 25 provided near the top of the inside surface of the walls 30 into which the function module latch 160 FIGS. 18, 19 and 21 engages for securing function modules 12 into cage 26.

Means are also provided on the base 32 for securing the control modules 14, 15 and 16, and the power modules 17 to the base 32. Such means is in the form of a hook 46 and a loop 48 which are formed on the base 32. It should be noted that the hooks 46 are provided below the slots 38 and 40 and the loops 48 are provided above the slots 38 and 40. The hooks 46 provide a resting surface and a pivot point for mounting the modules 14, 15 16, and 17 on the base 32. The loops 48 are used to secure the modules 14, 15, 16, and 17 to the base 32 as described hereinafter. It should be noted in FIG. 8 that a first slot type base frame 18 is shown. The slots are numbered from left to right 1#, 2#, 3#, 4# and 5# for slot reference.

A number of termination bays 50 are oriented vertically along the outside of cage walls 28 for housing the termination board assemblies 52. The termination boards 52 provide communication to slots 1# and 5#, respectively, for control modules 15 and 16 only. In this regard, the bays are formed by a number of partitions 54 formed in a parallel spaced relation along the outside of each outer wall 28. A recess 57 is provided on each side of the partitions 54 with a pair of slots 59 extending radially outward from the recess 57 FIG. 10. The bays 50 are closed by means of side walls 56 provided on the end of partitions 54. A slot 58 for each bay 50 is provided in the sidewalls 56. A number of termination bays 60 are oriented horizontally at the bottom of the base 32 for field termination board assemblies 52 for the control modules 16 located in slots 2# and 4#. The bays 60 are formed by a bottom wall 64, partitions 66 and closed by end walls 62. The bays 50 or 60 are closed by termination bay doors 65.

Figure 10:
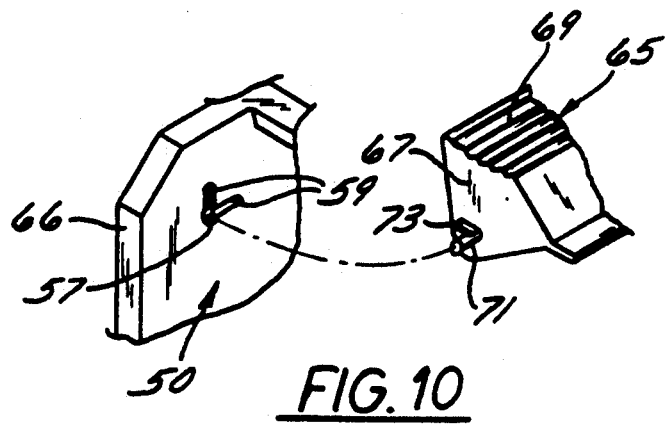
FIG. 10 is a perspective view of the pivot connection for the termination board assembly covers.

In this regard, each of the termination bay doors 65 is shown on FIG. 10, is provided with a cover 69 having side walls 67 at each end of the cover 69. A pivot pin 71 and stop rib 73 are provided on the outside of the sidewalls 67 as shown in FIG. 10. The doors 65 are pivotally mounted in the bays 50 or 60 by aligning the pivot pins 71 in the recesses 57 in the partitions 54 or 66. The stop rib 73 is seated in one of the slots 59 to "detent" the door into an open position or closed position with respect to the bay.

Main Wiring Board Assembly

Figure 11:
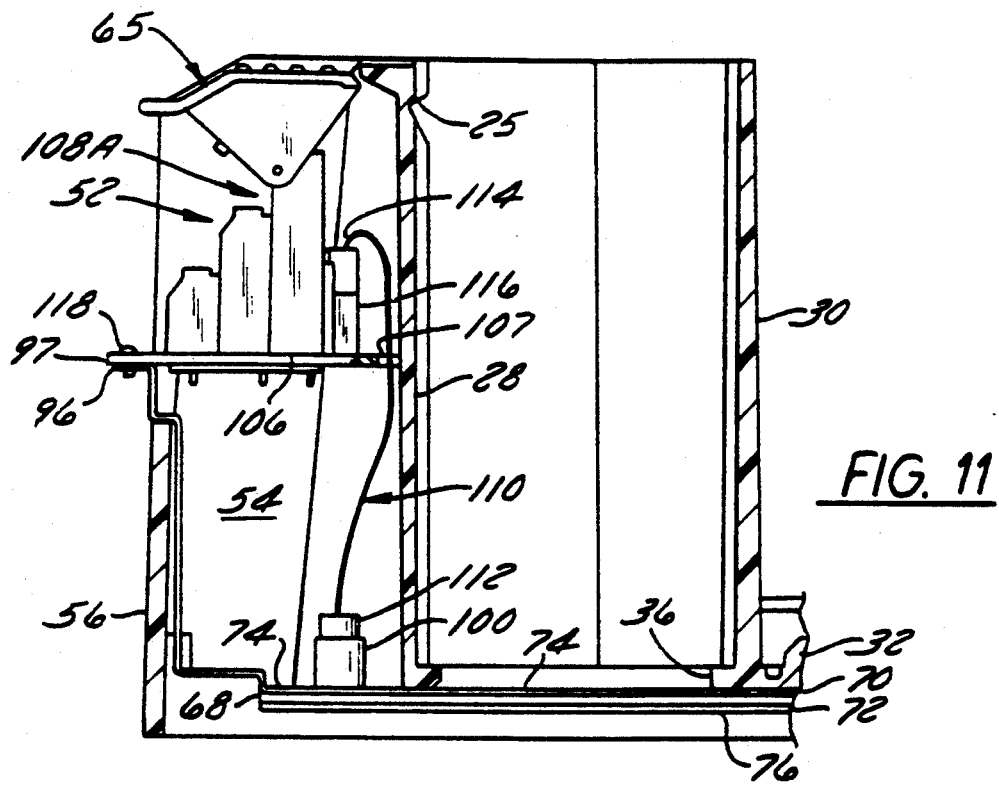
FIG. 11 is a side elevation view of one of the termination board assemblies shown mounted on the frame and connected to the circuit board.
Figure 32:
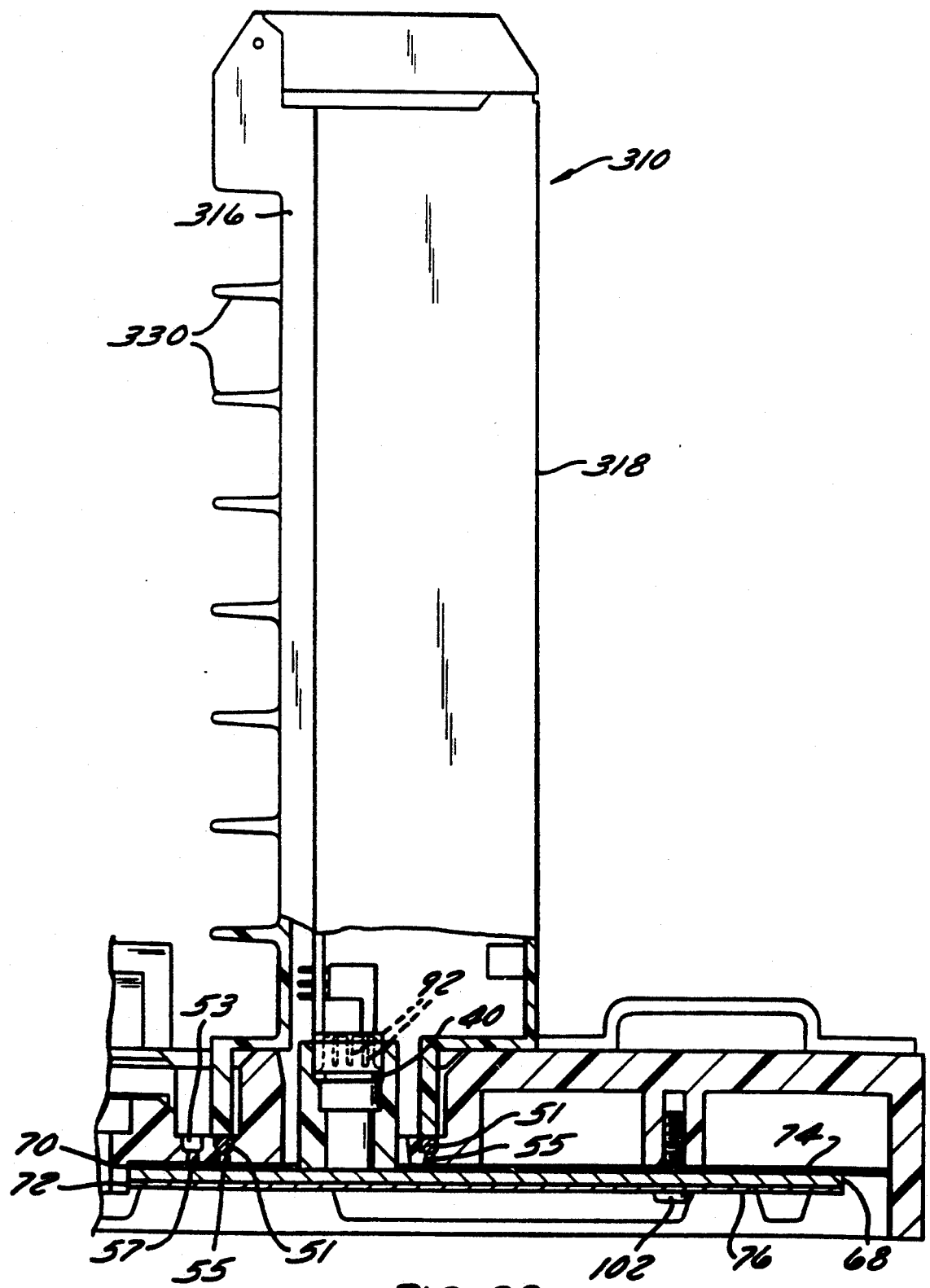
FIG. 32 is a view partly in section of the ground connection of a control module to the printed wiring board.

The main printed wiring board assembly 20 as shown in FIG. 9, 11 and 32 is in the form of a laminated assembly including a main printed wiring board 68, an inner insulation layer 70, an outer insulation layer 72, an inner ground shield 74, and an outer ground shield 76.

The printed wiring board 68 includes a plurality of printed wiring traces formed on a glass-epoxy base material. These traces form the circuits between connectors 78, 80 and 82 as described hereinafter. These connectors provide the circuit connections from traces to the cables and modules. These traces are insulated to prevent arcing and tracking from one another and from the adjacent environment by use of a coating process known in the industry as "dry-film." These traces are "double insulated" from the inner shield 74 and, the outer shield 76 by use of, respectively, an inner insulating layer 70 and an outer insulating lager 72. The inner, insulator layer 70 is of a flat thin plastic sheet material that has openings cut out through which the connectors, protrude. The outer insulating layer 72 of is of a thermoformed thin plastic sheet material. Pockets are thermoformed to provide clearance space for the connector pins which protrude from the back of the printed wiring board while providing an insulating layer between these pins and the outer sheet metal shield 76.

A shielding ground plane is formed around the printed wiring board 68 by the ground shields 74 and 76 which provide protection from both electron magnetic interference (EMI) as well as radio frequency interference (RFI). The shields are interconnected with one another by conductive self-tapping screws 75 to provide a low impedance path to form an effective enclosing shield for the traces formed on the printed wiring board 68. The outer ground shield 76 also provides physical protection for the back of the wiring board from rough spots which may be present on the support wall.

The outer shield 76 is formed from steel which is drawn out three dimensionally to eliminate any openings in the shield. The shield can then be plated to prevent corrosion. The inner shield 74 is formed from steel which is stamped and formed to the desired configuration and plated for corrosion. The shields 76 and 74 are connected to conventional "green-wire" ground.

The wiring board 68 as seen in FIG. 9 includes a first set of electrical connectors 78 in the form of receptacles for the function modules 12, a second set of electrical connectors 80 in the form of receptacles for the control modules 14, 15 and 16, a third set of electrical connectors 82 in the form of receptacles for the power modules 17 and a set of plug in connectors 100 for the termination board assemblies 52. All of the electrical connectors are standard series PCB DIN connectors type C, 1/26, D or F. The function module connectors 78, control module connectors 80, power module connectors 82 and plug in connectors 100 are interconnected through the printed wiring board assembly 20 as described in U.S. patent application Ser. No. 07/476,031.

Figure 22:
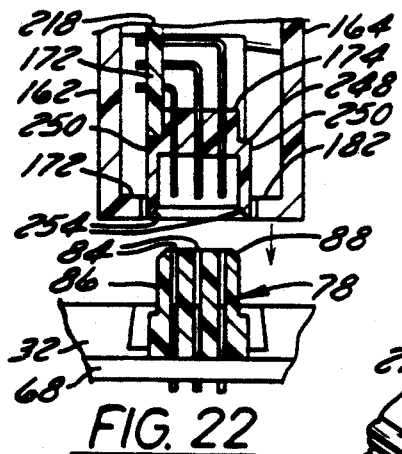
FIG. 22 is a cross-sectional view of the function module pin connector and receptacle taken on line 22—22 of FIG. 20 and shown in the open position.
Figure 22A:
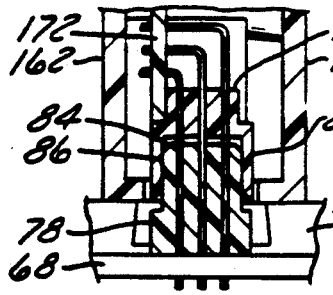
FIG. 22A is a view similar to FIG. 22 shown in the closed position.

Referring to FIGS. 22 and 22A a cross section view of one of the function module connectors 78 is shown which includes a block 86 having a plurality of electrical receptacle openings 84. A chamfered edge 88 is provided on the sides and ends of each of the blocks 86. Each of the control module connectors 80 and power module connectors 82 also includes a block 86 having a plurality of electrical receptacle openings 84 and chamfered edges 88.

It should be noted that the entire network control unit is provided with a modularized ground or Faraday shield which eliminates the requirement for separate grounding for the operators. This is accomplished by extending the ground shield from the main wiring board assembly 20 to all of the various components of the system.

In this regard, means are provided for grounding various of the components of the system to the ground shield 74 of circuit board assembly 20. Such means is in the form of a series of conductive braids 51 positioned in grooves or recesses 53 in the surface of the base 32 FIGS. 8 and 32. The braids 51 are connected to the inner ground shield 74 by means of a series of tabs 55 punched in the surface of the shield 74. Each tab 55 is aligned with a corresponding hole 57 in the grooves 53 in the base 32 shown in FIG. 32.

Figure 15:
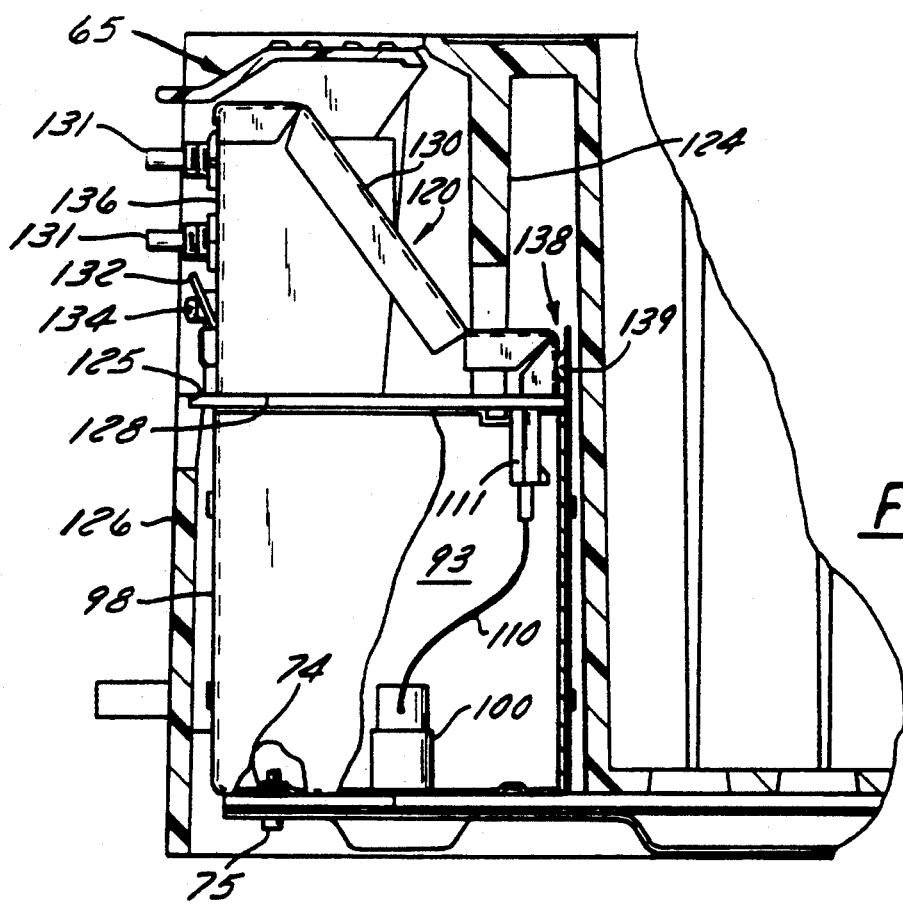
FIG. 15 is a side view of the communication termination board assembly shown assembled to the base frame assembly and connected to the main printed wiring
Figure 17:
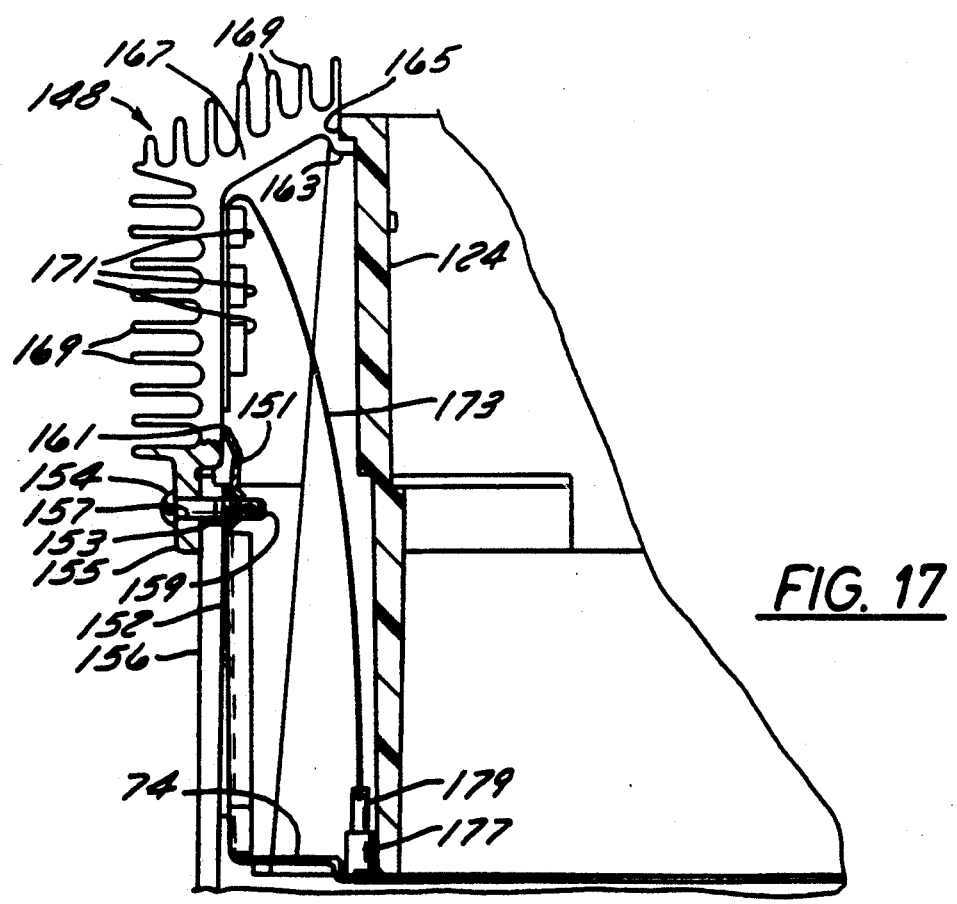
FIG. 17 is a view of the preload resistor module shown mounted on the base frame and connected to the main printed wiring board assembly.

The inner shield 74 is also provided with terminal board tabs 96 along each side which provide a ground connection for the termination board assemblies 52 as described hereinafter. A chimney 98 is mounted on the upper surface of the inner shield 74 to: 1) shield enclosed communication signal interconnect cable 110 between main printed wiring board and communication termination board, and 2) provide low impedance ground path between inner shield 74 and BNC bracket 120, FIG. 15.

The wiring board assembly 20 is secured to the back of the base 32 by thread forming screws 102. Four locating holes 104 are provided in the circuit board assembly 20 which matingly engage corresponding bosses 33 provided on the back of the base 32.

Termination Board Assemblies

Electrical connection of the field wiring to the wiring board assembly 20 is through the termination board assemblies 52, FIGS. 3, 4, 6, 7 and 11, which are mounted in the bays 50 and 60 in base frame 18. Each termination board assembly 52 includes a terminal board 106 having two sets of six screw terminals 108. The screw terminals 108 in each set are mounted on the board 106 in three rows A, B and C of different heights. The terminals 108 are arranged at different heights for ease of wire assembly. Each termination board assembly 52 includes a plug-in socket 116 which is connected to the circuit board assembly 20 by means of conductive ribbons 110 having one plug-in type connector 114 at one end and two plug-in type connectors 112 mechanically coupled together to form a single plug device at the other end. The connectors 112 are plugged into the motherboard socket connectors 100 on the wiring board 20 and the connectors 114 are plugged into the sockets 116 on the termination board assembly terminal board 106. The terminal boards 106 are seated in a notch 107 in the backwall and secured to the terminal board tabs 96 provided on the inner shield 74 by means of screws 118. Each of the terminal board tabs 96 includes a ground point or lance 97 which provides the ground connection for the termination board assembly 52.

Wire Barrier Guide

A wire barrier guide 470, FIGS. 40–45, is used to channel the line-voltage wires 475 from the wiring duct 24 to the screw terminals 108 on the termination board assembly 52 and thereby physically separate the line-voltage wires from the low-voltage wires and pneumatic tubes. The guide includes a wire barrier frame 472 and a number of wire barrier boots 474. The wire barrier frame 472 is mounted in the bays 50 or 60 in place of the bay doors 65. One or more wire barrier boots 474 are mounted on the barrier frame 472 to separate the line voltage wires 475 from the low-voltage wires and pneumatic tubes by enclosing the line-voltage wires 475 in the boot 474.

The wire barrier frame 472 includes a top panel 476 and a pair of side walls 478. Each side wall 478 includes a boss or ear 480 and a catch rib 481 which fit into the pivot recesses 57 and 59 FIG. 10 for the bay doors 65. A row of mounting flanges 482 are provided on the front of the top panel 476. Each of the mounting flanges 482 includes a load bearing beam 484 and a latch beam 486 in the form of a U with a tab 488 provided for locking the boot onto the frame on the end of the lowermost leg 486 of the flange 482. Once installed, the frame 472 also covers the screw terminals 108 to prevent accidental contact by an operator. The frame is constructed of hard plastic and has the same dark gray color as the base frame.

Each wire barrier boot 474 is made of a flexible elastomeric plastic into which the line-voltage wires 475 are channelled and enclosed to separate them from the low-voltage wires and pneumatic tubes. The boot 474 includes a back 490 and a pair of side walls 492 with a finger tab 494 mounted on the back. A flange 496 is provided at the upper end of the boot for load bearing against frame beam 484, and a J-shaped tab 498 for latching with frame latch beam 486 and locking against tab 488. The boot is mounted on the frame by inserting the flange 496 above the upper edge of the flange 484 on the frame 472. The J-shaped tab 498 is snapped over the tab 488 on the U-shaped flange 482. A tool must be inserted through opening 489 and must be leveraged to force tab 488 to clear tab 498 by flexing beam 486 in order to remove boot 474 from frame 472. A removable extension 500 is provided at the lower end of the boot, which is defined by a groove 502 around the bottom of the boot. The extension 500 can be broken from the boot 474 when the boot is to be installed in bays of a shorter length.

Communication Termination Board

The communication termination board 120, FIGS. 1, 5, 7, 12-15, provides for the termination of the N1 Bus, N2 Bus and L2 Bus. The board 120 is mounted in a bay 122 provided in the top of the frame 18. The bay 122 is formed by a partition 124, the extension of inner wall 30, and a top wall 126. A noise or Faraday shield is provided by the chimney 98 which is mounted on the inner shield 74 of the wiring board assembly 20 and aligned within the walls of bay 122. The termination board 120 includes a printed circuit board 128 having various electric circuit devices soldered thereon, two sets of terminal blocks 108, an enclosing steel shield 130 and 136 which is mounted thereon and two coaxial "BNC" connectors 131. The terminal blocks 108 provide the connections for the N2 Bus and L2 Bus. The two coaxial BNC connectors 131 provide for the connection of the N1 Bus to termination board 120. The BNC connectors provide both electrical connection as well as the ground connection of the ground shield of the coaxial cable to the ground shield 74 via shield 136, chimney 98 and screw 75.

The printed circuit board 128 is mounted on the base frame by aligning the edge of panel 128 with a notch 125 in the edge of top wall 126. The front of the shield 136 is aligned with tab 132 on chimney 98 and connected thereto by means of a screw 134 which also provides a ground connection for the termination board 120 to the inner ground shield 74. A secondary ground connection 138 in the form of a number of fingers 139 provided at the back of the chimney 98 which engages the back of shield assembly 136. The terminal blocks 108A and 108B and the shield assembly 136 are connected to the main wiring board 20 by means of the conductive ribbons 110. In this regard, the ribbon 110 for the communication board assembly 120 is connected to socket connector 100 in chamber 93 and to the electrical, connector 111 on board 128. The terminal blocks 108 are connected to a socket connection (not shown) in chamber 91.

Power Circuit Assembly

The power circuit assembly 140, FIGS. 1, 2, 5 and 7, is a conventional assembly which includes a filter 142 and a primary power box 144. The power box 144 includes a circuit breaker or power switch 146A and a pair of outlets 146B. The filter shield/bracket 141 is mounted on the main printed wiring board assembly 20, FIG. 9. The filter 142 is enclosed in a box 144 which is mounted on the main wiring board assembly 20 and connected to a tab 33 at the top of end wall 34 by a screw 129. The box 144 is connected to a power source through an opening 145 in the base frame 32. The filter 142 is grounded to the shield 74 by means of a conductive screw 143 which passes through an opening 135 in tab 137 which is connected to shield 74.

Preload Resistor

A preload resistor module 148, FIGS. 2, 3, 5, 6, 7, 16 and 17 provides a minimum electrical resistive load for base frame power supplies, allowing the supplies to stay in regulation with no other loads. The resistor module 148 is mounted in a bay 149, FIGS. 7 and 8, provided at the top of the frame 18. The bay 149 is enclosed by side walls 150, FIGS. 7, 8, formed on partition 124 and the side wall 56. A ground plate 152 FIG. 17, formed on the inner shield 74 extends upwardly in bay 149 in close proximity to wall 56. A tab 151 on the end of plate 152 is aligned with a slot 153 provided in wall 56.

The resistor module 148 includes an aluminum extrusion 167 which includes a flange 155 at the bottom and a flange 163 at the top. A number of cooling fins 169 are provided on the outside of the extrusion. A number of preload resistors 171 are mounted on the inside of the extrusion 167 which are connected to a socket connector 177 on the main printed wiring board assembly 20 by a ribbon 173 and a plug 179. A screw 154 passes through the slot 153 and engages an extruded tapped hole 159 in plate 152. Means is provided for forming a gas tight ground connection with the extrusion 167. Such means is in the form of a lance/form tab/spike 161 at the end of tab 151 which is bent slightly to engage the extrusion 167. When the screw 154 is tightened, the spike 161 of tab 151 will be drawn into tight engagement with the back of extrusion 167 to form a gas tight ground connection. The extrusion 167 also includes a flange 163 at the top which matingly engages a flange 165 at the top of partition 124. The extrusion 167 is thereby locked into the bay when secured to the ground shield.

Function Module

The function modules 12, FIGS. 1-4 and 18-23, each include a cartridge or shell 156 having a dress piece 158 mounted thereon and a latch 160 pivotally mounted on the shell 156. The cartridge or shell 156 includes a bottom shell 162 and a top shell 164. The bottom shell 162 includes a side panel 166 having walls 168, 170 along each edge and an end wall 172. An inner lip 174 is provided on each of the walls 168, 170 and 172. The top shell 164 includes a side panel 176 having walls 178, 180 and an end wall 182. The walls 178, 180 and 182 include an outer lip (not shown) which overlaps the inner lip 174 on the bottom section 162 on assembly of the shells 162 and 164. The end walls 172, 182 on the end of each shell form an opening 184 in the bottom of the shell 156

The top of the cartridge or shell 156 is closed by means of the dress piece 158 which includes a number of tabs 188 along each edge which engage a corresponding number of holes 190 along the upper edge of the side panels 166 and 176.

The shell 156 is aligned in the cages 26 by means of guide ribs 175 provided on walls 178 and 180. Each rib 175 is aligned in one of the guide grooves 42 and 44 in cages 26. The shell is centered in the tapered grooves 42 and 44 by means of an enlarged head 177 provided on the end of rib 175.

Figure 19:
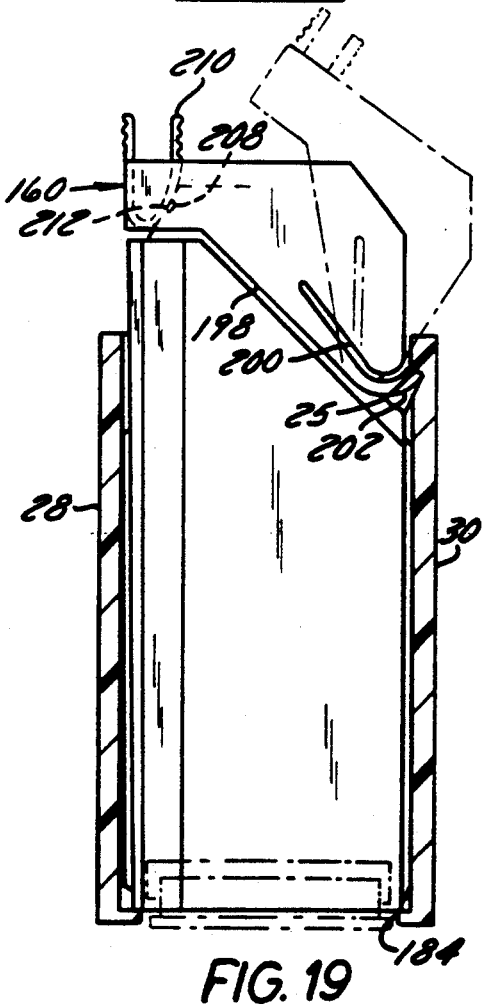
FIG. 19 is a side view of the function module shown locked in the function module cage portion of the base frame chassis.
Figure 30:
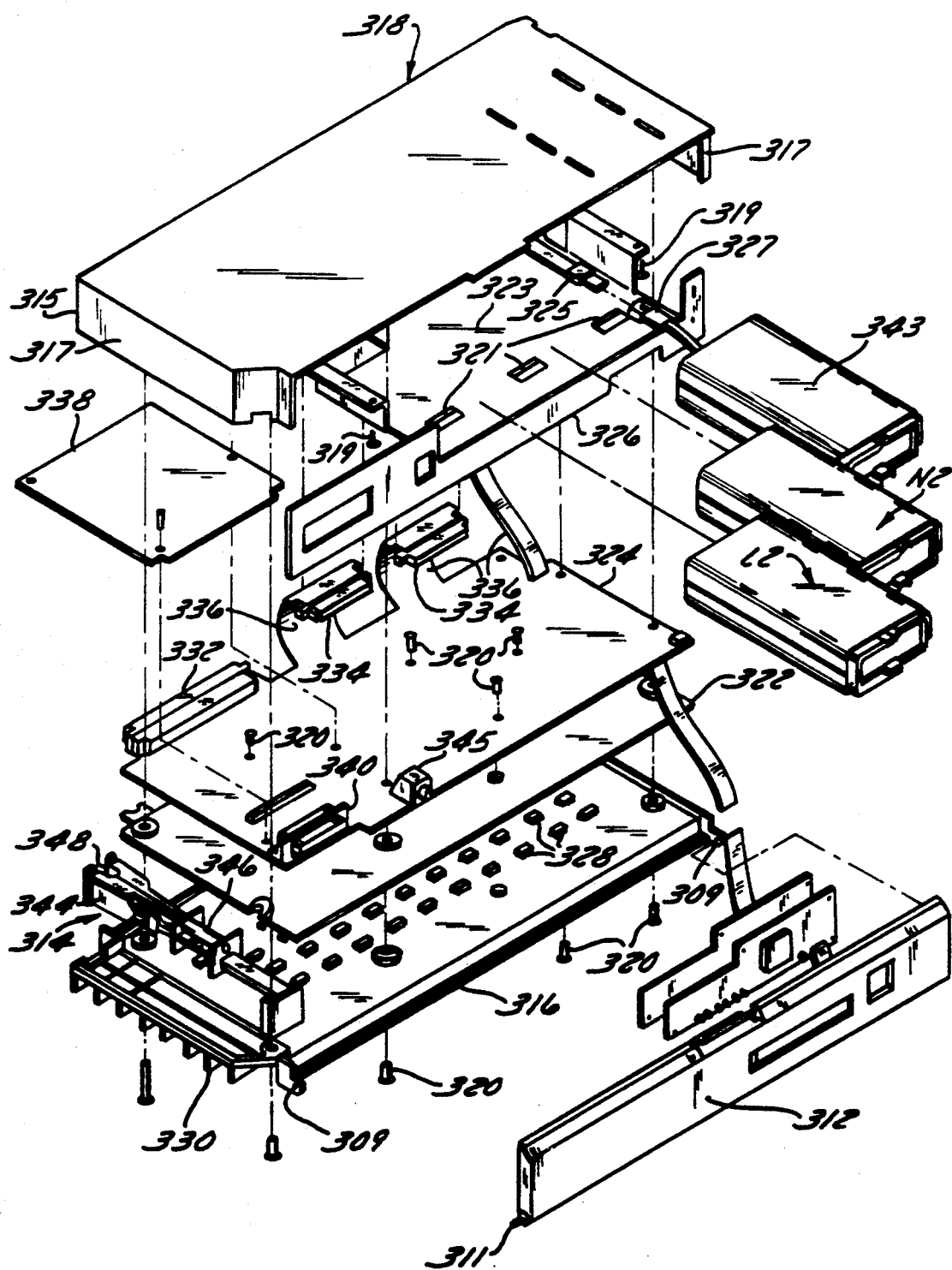
FIG. 30 is an exploded perspective view of one of the network control module.
Figure 31:
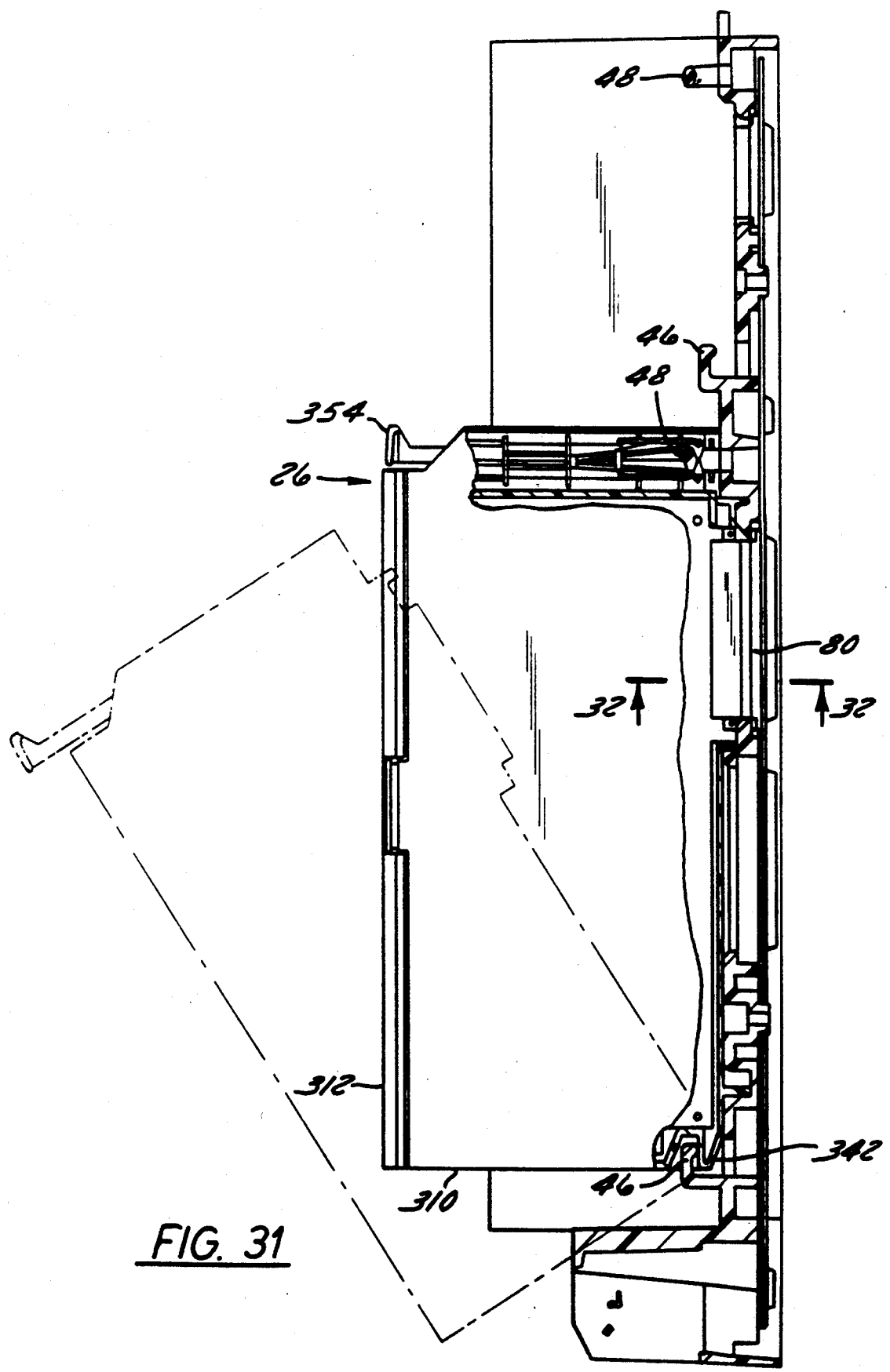
FIG. 31 is a side elevation view showing the control module mounted on the main frame and connected to the main printed wiring board.

The shell 156 is locked into the cage 26 between walls 28 and 30 by means of the latch 160 which is pivotally mounted on the top of the shell 156. The latch 160 is formed or molded as a one piece unit having a pair of side walls 194 connected by an end section 196 and a back section 198. Each of the side walls 194 includes a resilient "J" shaped slot 200 which defines a J-shaped extension or arm 202 connected to the back section 198. The latch 160 is pivotally mounted on the cartridge 156 by inserting bosses 204 into recesses 206 provided on the outside of side panels 166, 176. The latch 160 is locked in the closed position by means of a tab 208 mounted on a finger grip 210 which engages a slot 212 in the end of the side panels 166 and 176. Referring to FIG. 19, the latch 160 is shown in the locked position in the cage with the resilient arm 202 engaging the groove or lip 25 provided in the wall 30. With this arrangement the function module will be biased downwardly into engagement with the function module connectors 78 on the main circuit board assembly 20.

A function module circuit board assembly 218 is provided in the cartridge 156 to support the module electronics. The board is in the form of a printed circuit board 220 having a DIN type connector 222 mounted on one end of the panel and a pair of switches or other similar electromechanical devices 224 mounted on the other end. Each switch 224 includes an actuating plunger 226. Means are provided for actuating the switches 224 externally of the cartridge 156. Such means is in the form of a U-shaped cap or shuttle 228 having a pair of holes 230 and a tab 232 on the top of the cap. The shuttle 228 is positioned on the top of the switches 224 with the plungers 226 projecting through holes 230. The shuttle 228 is moved laterally with respect to the plungers by means of a toggle 234 having a lever 235, a groove 236 and a hub 238 on each side. A stub axle 240 is provided on each hub 238. The lever 235 is mounted on the circuit board 218 by aligning groove 236 with the tab 232 and inserting one of the hubs 238 through a hole 242 in the panel 220. The axles 240 are inserted into axle hubs 244 provided on the inside of each panel 166, 176. The end of the lever 235 projects through a slot 246 in the dress piece 158 for external operation of the switches 224. The lever 235 is initially centered in slot 246 with both switches in an "off" mode. Pivoting the lever 235 will slide the shuttle 228 one way or the other to actuate the switches 224 to provide for hand or automatic operation of the system.

Figure 20:
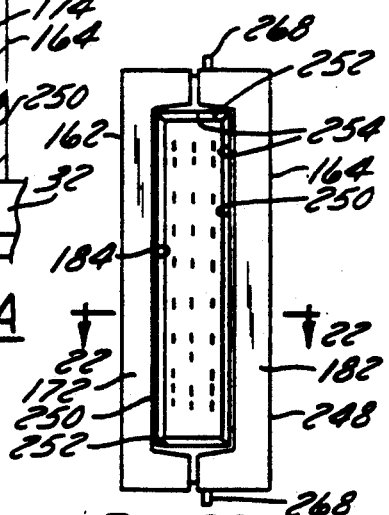
FIG. 20 is a bottom view of the function module showing the DIN connector.

A guide 248 is provided on the end of the circuit board 220 to guide the connector 222 into engagement with one of the function module connectors 78 on the main wiring board 68. The guide 248 as shown in FIGS. 20, 21 and 22 includes a pair of side walls 250 and a pair of end walls 252. Each of the walls 250, 252 includes an inner beveled edge 254 which cooperates with the chamfered edges 88 provided on the function connector 78 on the main wiring board 68 to align the connector 222 with the function connector 78.

It should be noted that the wiring board assembly 218 is movable in all three axes with respect to the cartridge 156 in order to allow the connector 222 to matingly engage the corresponding function connector 78 on the main circuit board 68 and to eliminate residual stresses in mechanical components (e.g. connector pins) once mating has occurred. Longitudinal movement of the connector 222 is achieved by mounting the panel 220 on pivot pins 268 as shown in FIGS. 21 and 23. Each of the pins 268 is seated in a boss 270 in the section 162 and matingly engages the bore 272 in boss 270 on the inner section 162. One of the pins 268 passes through a pivot hole 264 in panel 220 which allows the board to pivot on pin 268. It should be noted that the panel 220 is free to pivot with respect to the pin 268 within the limits of slots 266 provided on the edges of panel 220 which are aligned with mounting pins 268 in bosses 270 on the lower end of the board 220.

In this regard and referring to FIG. 23, each of the mounting pins 268 is secured to the inner surface of panel 176 by means of fillets 269 which terminate at a flat surface 271. The pin 268 is seated in the bore 272 in boss 270 on the inner surface of panel 166. An interference fit is provided between the pin 268 and bore 272 in boss 270 to hold the shells 162 and 164 together. The space between the end of boss 270 and the flat surfaces 271 allows the board 220 to move axially with respect to the pin 268.

Universal Function Module

A universal function module 280, FIGS. 24–27, may be substituted for one of the function modules 12 when required. The universal module includes a mounting bracket 282 and a printed circuit board 284. The bracket 282 is one integrally molded unit and includes a latch 286 and a pair of mounting assemblies 288 for supporting the board 284. The assemblies 288 are arranged to allow for three axes of motion of printed circuit board 284 with respect to mounting brackets 282. The circuit board 284 includes a pair of mounting holes 292 which matingly engage the mounting assemblies 288 to allow the board 284 to move in three directions with respect to the bracket 282 to align the connector 294 with one of the function module connectors 78 on the main wiring board assembly 20.

In this regard, each mounting assembly 288 includes a pair of brackets 296, 298 each having a tab 300, 302, respectively. The brackets 298 include arcuate guides 304 on the ends of the brackets 298. The circuit board 284 is mounted on the brackets by aligning the holes 292 with the assemblies 288. The board is thus free to move within the limits of the holes 306.

The bracket 282 is mounted in the cage 26 by aligning the ribs 306 and 308 in slots 42 in wall 30. The latch 286 is cammed inward by the flange 283 on tab 285 to move the tab 285 away from wall 30. The tab 285 is then seated in groove 25 in the wall 30 to lock the bracket 282 in the cage 26. The circuit board 284 is then free to move with respect to electrical connector 78 in the same manner as wiring board 218 to seat connector 294 on contact 78. The bracket 282 is removed by squeezing latch 286 to move tab 285 from groove 25.

Control Modules

The network control module 14 as shown in FIGS. 28–31 generally is used to package the network controller electronics, and communication interface modules. Field I/O connections such as function module connections and field wiring connections are made through the digital control modules 15. The expansion module 16 is used to package digital input/output signal conditioning electronics, appropriate N2 Bus interface electronics, and certain electromechanical field interface devices. All of the above are packaged in a similar type cartridge 310. Although the following description relates to a network control module 14, the same type cartridge is used for the expansion and digital control type modules 16 and 15, respectively.

The cartridge 310 generally includes a side wall panel 316 and a cover 318. The side wall panel 316 and cover 318 are both formed from electrically conductive material to provide a ground connection to the main printed wiring board assembly 18. The panel 316 also provides heat sinking for the packaged electronics. The cover 318 includes a back wall 315 and end walls 317. The cover 318 is mounted on the side wall panel 316 and secured thereto by screws 320. A door 312 is pivotally mounted on the side wall panel 316 by means of a pivot pin 311 aligned in an openings 309

More particularly, the cartridge 310 includes an insulation panel 322 and a printed circuit board 324 which are secured to the side wall panel 316 by screws 320. A support panel 323 having a dress piece 326 on the front is secured to the cover 318 by screws 319. The dress piece 326 is captured between the cover 318 and panel 316 upon assembly. The panel 316 is made of magnesium and includes a plurality of bosses 328 on the inside surface and a plurality of fins 330 on the outside surface. The panel 316 acts as a heat sink and is cooled by air passing over the fins 330. The bosses 328 provide a clearance space pins between the insulation panel 322 and the panel 316. The bosses 328 provide an effective heat sinking path from high thermal electronic or electrical components on circuit band 32 to heat sink panel fins 330. The circuit board 324 includes a primary connector 332 for connection to one of the control module connectors 80 on the circuit board 68. A pair of submodule connectors 334 are electrically connected to the circuit board 324 by straps 336, but are structurally mounted on panel 323 and latched into place by spring biased tabs 321.

The network control module may include an arc net or daughterboard assembly 338 which is mounted on the circuit board assembly 324 and connected to an arc net connector 340. The arc net board assembly 338 provides the main communication interface between digital electronics and the N1 Bus. A dedicated battery pack 343 is mounted on the panel 323 and is connected to the circuit board assembly 324 by a plug 325 and a receptacle 327. Submodules (L2, N2) may be mounted on the dress piece 326 and electrically connected to the wiring board assembly 324 by connectors 334. The battery and L2, N2 submodules are "pluggable" modules accessed through the control module door 312. The submodules provide communication to the N2 Bus, L2 Bus. modem submodule or RS-232 part. Only two of the submodules may be mounted on the dress piece slots at one time.

The wiring board assembly 324 is a high density type board having a multiple layer circuit board having power and ground layers separated by insulation panels. The power and ground layers collect most of the heat which is transferred to the bosses 328 on the heat sink panel 316. The board is provided with plated through holes (PTH) for transferring the heat to the bosses. High temperature operating chips are connected to the bosses by through holes provided in the board. Surface mounted electrical components (resistors, diodes, etc.) mounted on the top or primary side of the board are connected to the bosses by through holes. Surface mounted electrical components mounted on the bottom or secondary side of the board are mounted between the bosses in thermal communication therewith.

The control modules 14, 15, and 16 and power modules 17 are connected to the base frame or chassis 18 by means of hooks 46 and loops 48. In this regard and referring to FIG. 31, one of the network control module cartridges 310 is shown mounted on the frame 18. Each cartridge 310 is mounted on the frame by means of a catch 342 and the latch and lock assembly 314. The catch 342 is provided at the lower end of the cartridge which engages one of the hooks 46. The latch and lock assembly 314 is provided at the other end of the cartridge and engages the corresponding loop 48. This entire arrangement allows for the entire module to "float" during insertion to provide for self-alignment and to thereafter eliminate residual structural stress after insertion and latching.

Figure 31A:
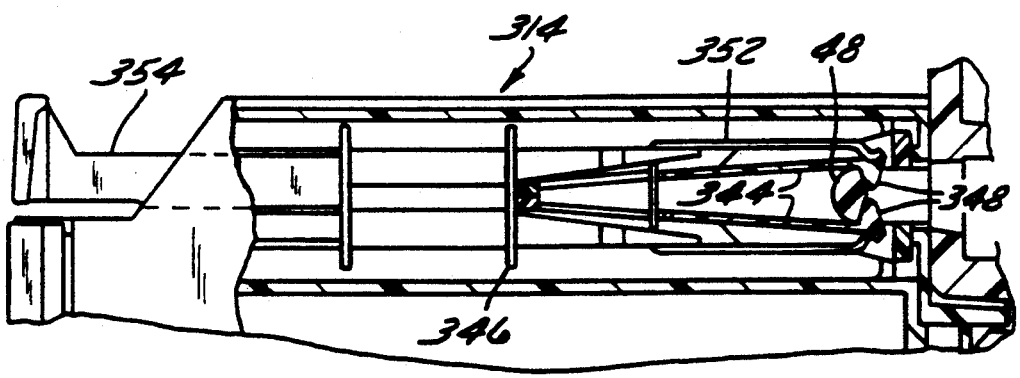
FIG. 31A is an enlarged view of the lock position.
Figure 31B:
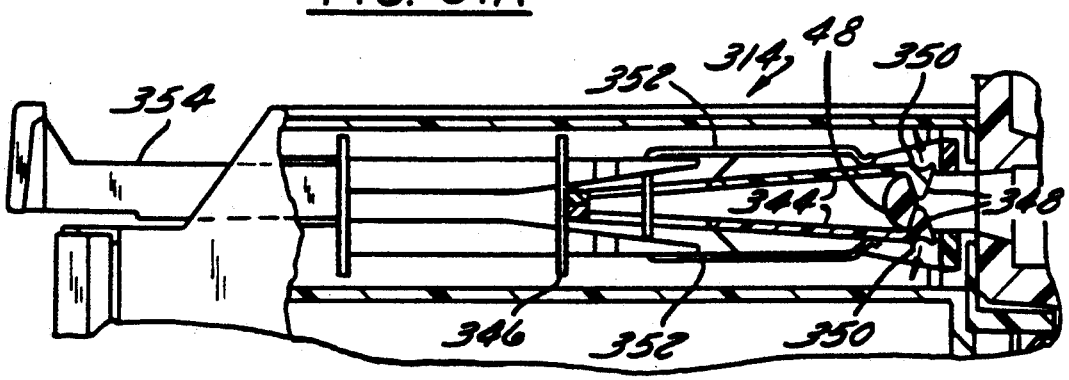
FIG. 31B is a view similar to FIG. 31A showing the lock in the release position.
Figure 13:
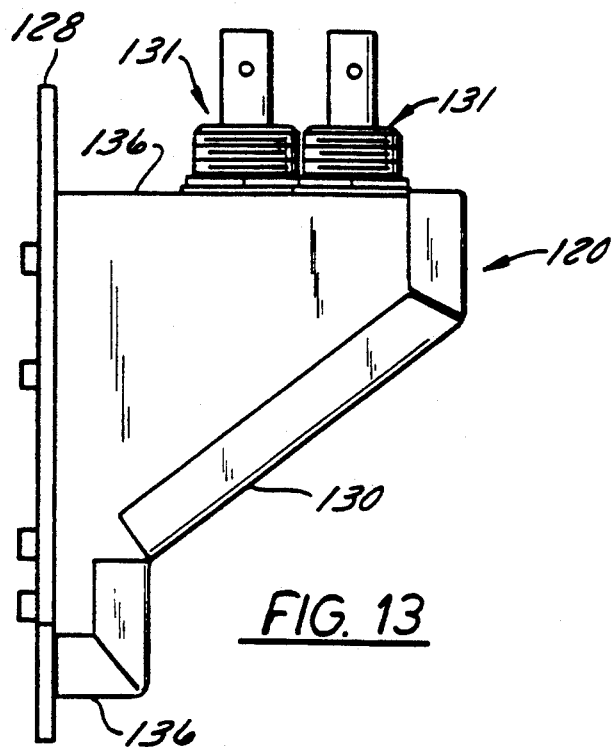
FIG. 13 is a side view of the communication termination board assembly.
Figure 12:
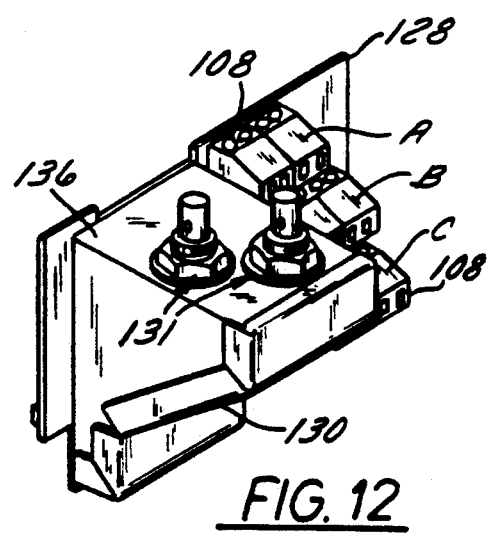
FIG. 12 is a perspective view of the communication termination board assembly.
Figure 14:
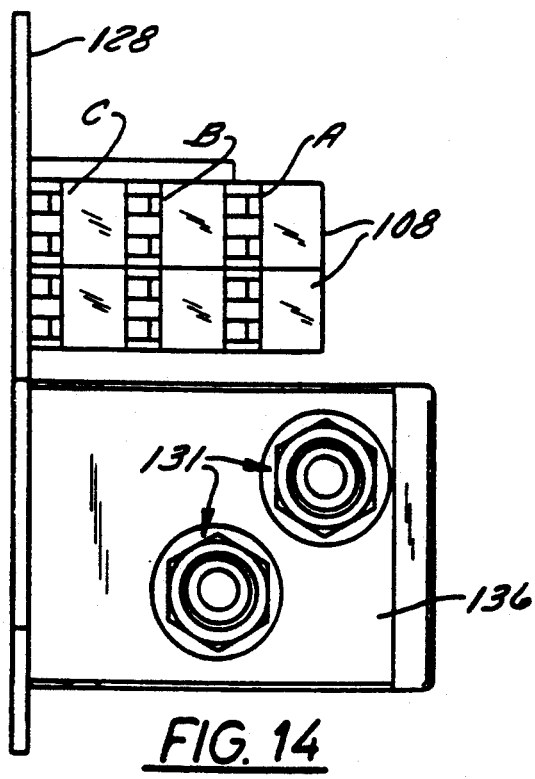
FIG. 14 is a front view of the communication termination board assembly.
Figure 16:
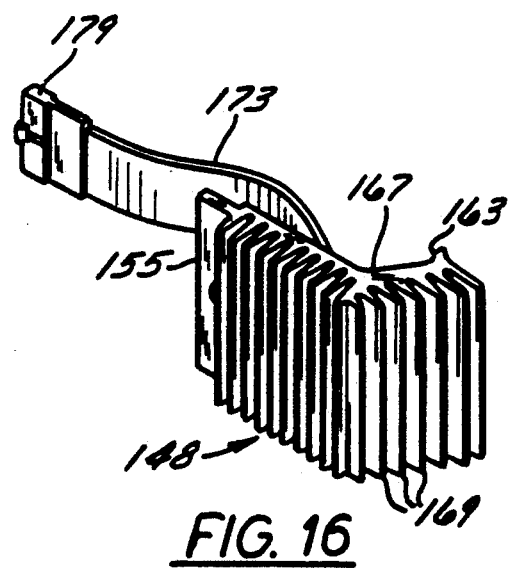
FIG. 16 is a perspective view of the preload resistor module.

As shown in FIGS. 31A and 31B, the latch and lock assembly 314 generally includes a first pair of flexible arms 344 mounted on a fixed plate 346. The arms 344 each include a catch 348 at the free end. Grooves 350 are provided in the back of each catch 348. The arms 344 are sufficiently flexible to allow the loop 48 to cam the catches 348 outward of disengagement with the loop 48.

The catches 348 are locked under the loop 48 by means of a U-shaped spring 352 which is mounted on a plunger 354. The plunger 354 is mounted for axial movement with respect to plate 346. When the plunger 354 is pushed downward, the arms of spring 352 will bias the arms 344 inward toward the loop 48 to lock the catches 348 under the loop 48. The latch is released by pulling the plunger 354 outwardly to move arms 352 away from the arms 344. The catches 348 will be free to move outwardly by the contour of the loop 48.

The modules 14, 15, 16 and 17 are grounded to the inner shield 74 of the circuit board assembly 20 by means of the tabs 55 which engage electrically conductive braids 51 in the grooves 53 in frame 18. In this regard and referring to FIGS. 8 and 32, the grooves 53 are shown in a parallel relation to the slots 38 and 40 in the base frame 18. The modules are mounted on the base frame with the lower edges of the modules seated on the braids 51. The Faraday shield is thereby extended to the modules as they are mounted on the base frame 18.

There are two basic network control modules 14. The first contains an N1 daughterboard as noted above to communicate over the N1 network. The alternate version of the network control module does not contain an N1 daughterboard. Interface to the network control module 14 can be made with either a Network Terminal E or an Operator workstation A FIG. 1. All Network Control Modules 14 contain (1) a port 19 for a directly connected Operator Workstation, (2) a port 345 (6-pin telephone jack) for the Network Terminal E, and (3) a NiCad battery submodule 343 to maintain RAM programs and databases for up to a seventy-two hour power failure. Two slots remain open in the network control module 14 that can be filled with any of four submodules. N2 submodule required for communication over N2 Bus, RS-232C Port provides additional RS-232C port for printers or external modem, a Modem Submodule Integral dial-in/dial-out modem allows monitoring and remote programming over voice-grade telephone lines and an L2 Submodule required for communication over the L2 Bus; interfaces to C210 VAV box controller and a C260 heat pump controller. It should be noted that in all configurations the Network Terminal E, Modem Submodule N2, L2 and RS-232C port 19 connections provide access to the entire network, not just to the connected network control modules.

Enclosure

The network control unit 10 as described herein can be mounted on a wall or in an enclosure 22 of the type shown in FIGS. 33, 34, 35 and 36. The enclosure 22 generally includes a case 358 having a back wall 360, side walls 362, a top wall 364 and a bottom wall 366. A cover 368 is removably mounted on the front of the top wall 364 and includes an access door 370 and a network terminal panel 371. The cover 368 is locked to the bottom wall 366 and the access door 370 is locked to the cover 368. The cover 368 can be removed to expose the wiring ducts 24 for wiring the control panel assembly 10. The access door 370 is opened to provide access to the modules 12, 14, 15, 16 and 17.

A unique key lock assembly 372 is provided on the front of the cover 368 for selectively opening the cover 368 or the access door 370. In this regard and referring to FIGS. 35 and 36, the cover 368 is supported by a pair of brackets 374 mounted on the top wall 364. The brackets 374 include a vertical flange 376 on the outer end. The cover 368 is provided with a pair of box shaped supports on the upper corners, and a number of ribs 382 for engaging the flange 376 on the mounting bracket 374.

A cover latch assembly 384 is provided at the bottom of the cover 368 for securing the cover to the bottom wall 366 of the case 358. The latch assembly 384 includes an L-shaped latch 386 having legs 385 and 387. A pair of pivot posts 390 are provided at the intersection of legs 385 and 387. The pins 390 are pivotally mounted in grooves 392 in brackets 394 molded in the bottom of the cover. The pins 392 are retained in the grooves 392 by a retainer plate 396 secured to brackets 394 by screws 395.

The latch 386 includes catch 400 at the end of leg 385 which is positioned to engage a recess 402 in the bottom wall 366 of case 358. The latch 386 is biased into engagement with the recess by a compression spring 388 positioned between the leg 387 and the inside wall of the cover.

The latch 386 is released from the recess 402 in the cover by means of a release bar 404 which is mounted for longitudinal movement in a pair of slots 401 provided in brackets 403 in the cover. The release bar 404 slides on a pair of tabs 406 provided on the top of retainer plate 396 and is retained thereon by a flange 408. The release bar 404 is provided with a cam surface 410 which is positioned to engage leg 387 and pivot the L-shaped latch 386 to release catch 400 on leg 385 from the recess 402 in the cover. The release bar 404 is moved between open and closed positions by means of a key lock 412 mounted in the cover 368. The lock 412 includes a cam plate 414 a pin 416 at the outer edge which, engages a vertical slot 418 in the end of release bar 404.

Rotation of the plate 414 by a first key clockwise from the front of the cover will move the bar 404 to the right so that cam 410 engages leg 387 to pivot the latch 386 and release the cover.

The access door 370 is pivotally supported in the front of the cover 368 by means of a pair of hinge brackets 420 having pivot pins 422 which are aligned in slots 421 molded on the inside of the cover 368. It should be noted that access door 370 can be lifted out of the slots 421 and removed from the cover when the door is open. The access door 370 is locked to the cover by a door latch assembly 424 which includes a latch 426 and a release bar 428. The latch 426 includes a slot 430 at one end and a catch 432 at the other end for engaging a recess 434 in the access door 370. A pair of pivot posts 438 are provided at one end of the latch for pivotally supporting the latch 426 in grooves 440 in the cover. A retainer plate 442 is mounted on the cover to hold the pins 438 in the grooves 440.

A leaf spring 444 is mounted in the slot 430 on the latch 426 for biasing the door 370 outward when the catch 432 is released from the recess 434 in the door 370. The leaf spring 444 has one end connected to a bracket 436 on the back of catch 432 and projects through slot 430 in latch 426 in a spaced relation to catch 432. The latch 426 is biased into engagement with the door by means of a compression spring 450 which is positioned between the bracket 436 and the retainer plate 442. The latch 426 is released from the door 370 by the release bar 428 which is mounted for longitudinal movement in a slot 452 in the cover 360 and retained therein by tabs 454 on retainer plate 442. The release bar 428 includes a cam surface 456 which is positioned to engage the bracket 436 on latch 426. The release bar 428 also includes an arm 458 which is positioned to override the bracket 436 to prevent tampering with the latch when in the locked position.

The door release bar 428 is connected to the cover release bar 404 by a cable 460 so that the door latch assembly 424 is opened when the arm 414 on lock 412 is rotated by a second key counter-clockwise. Means are provided for returning the door release bar 428 to the closed position when locked. Such means is in the form of a compression spring 462 which is mounted in a slot 461 in the release bar 428. One end of the spring 462 is centered on a tab 429 in slot 461 and the other end of the spring is seated on a fixed bracket 464 on the cover 360.

It should be noted that the cover is provided with louvers 466, FIG. 34, between the ribs 468 on the front and top of the cover. The louvers are provided to allow for the free flow of air from the bottom through the control panel assembly 10 and out through the top. In some installations where air circulation may be poor, a fan pack may be mounted on the top of the base frame 18. The fan pack will be used to draw air from the bottom of the base frame through the modules for discharge out through the louvers at the top of the cover.

Network Terminal Cradle

Referring to FIGS. 37, 38 and 39a network terminal 504 in shown stored in a cradle 506 mounted on a two-slot or five-slot base frame. The cradle 506 may also attached to the inside of the enclosure cover 368 for either of the base frames. Alternatively, where a remote network terminal is used, the cradle can be mounted directly onto a wall.

The cradle 506 generally includes a cradle box 508, a pair of mounting legs 510 for securing the cradle to the main frame 18, and a pair of offset legs 512 mounted on the back of the cradle box. The cradle box includes a back 514, a pair of side walls 516, a top wall 518, and a bottom wall 520. The bottom wall 520 includes a step 522 in the front of the box which is connected to the bottom wall 520 by a tapered section 524. A pair of channels 526 are provided in the back wall with a pivot block 528 molded in the channels 526. The top wall 518 including a flange 530 having a retaining latch 546 mounted thereon. A tab 548 is provided in the front of flange 530 to push the flange upward to release latch 546 from the network terminal 504. A pair of mounting flanges 538 having channels 540 in the back are provided at the top of the top wall 518. Mounting flanges 542 are also provided on the front of each of the side walls with a pair of bolt holes 544 provided in each flange.

The cradle 506 is mounted on the bottom of the base frame, 18 inside of the enclosure. The blank-off panel 371 in the enclosure cover is removed to provide access to the cradle. The mounting legs 510 are aligned with the cradle bosses 511 at each side at the bottom of the base frame 18 and secured to the base frame by screws at the inner end of the cradle bosses. The two offset legs 512 are positioned in the channels 526 at the back of the cradle and secured thereto by screws 527. The two offset legs 512 provide direct support to the back of the base frame. The cradle is then aligned in the enclosure with the flanges 538 matingly engaging the mounting legs 510 and being secured thereto by screws 509. It should be noted that the mounting legs can be adjusted in width to accommodate either the two- or five-slot model frames. Once the cradle has been installed on the frame, the network terminal 504 is positioned in the cradle 506 by seating the bottom of the network terminal on the bottom of the cradle and pushing the upper end of the network terminal 504 into the box until engaged by a retaining latch 546. To remove the network terminal from the cradle, a tab 548 on latch 546 is pushed rearward to release the top of the terminal from the latch 546. The bottom of the network terminal is pushed inward to pivot the top of the terminal around the pivot block 528.

The network terminal 504 is locked into the cradle when the access door 370 on the cover is closed. This is accomplished by means of a flange 550 provided on the top of tab 548 which engages the flange on the door when the door is closed. The tab 548 cannot be pushed upward until the door, is opened, thus preventing removal of the network terminal until the door is unlocked.

Thus, it should be apparent that there has been provided in accordance with the present invention a facility management system that fully satisfies the aims and advantages set forth above. Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The embodiments of the invention in which an exclusive property or privilege is claimed are defined as follows:

1. A network unit for controlling the operation components of a facility management system, said unit comprising:
   a base frame having a front and a back,
   a number of control modules mounted on the front of said base frame,
   a power module mounted on the front of said base frame for each control module,
   a cage of the front of said base frame,
   a number of function modules mounted in a parallel spaced relation in said cage on the front of said base frame,
   a main printed wiring board assembly mounted on the back of said base frame for electrically interconnecting said function modules, control modules, and power modules, and
   a number of termination board assemblies mounted on said base frame for connecting the components of the facilities management system to said main wiring board assembly.

2. The unit according to claim 1, wherein said cage includes means for guiding said function modules into engagement with said main printed wiring board assembly.

3. The unit according to claim 2, wherein said guiding means comprises a row of slots on each side of said cage, each function module including a rib on each side, each rib matingly engaging one of said slots on each side of the cage to align said function modules in said cage.

4. The unit according to claim 3, including a lip on one side of said cage transverse to said slots and each of said function modules includes means for releasably locking said function module to said lip.

5. The unit according to claim 4, wherein said locking means comprises a latch pivotally mounted on each of said function modules for movement between open and closed positions with respect to said lip, said latch including a resilient extension for biasing said module into said cage when said extension engages said lip.

6. A network unit for controlling the operational components of a facility management system, said unit comprising:
   a base frame assembly,
   a number of control modules mounted on said assembly,
   a power module mounted on said assembly for each control module,
   a number of function modules mounted on said assembly,
   a main printed wiring board assembly for electrically interconnecting said termination board assemblies, function modules, control modules, and power modules, and
   said base frame assembly including a number of termination board assemblies, for connecting said network unit to the operational components of the system each of said function modules includes a wiring board, an electrical connector mounted on said wiring board, and means supporting said wiring board for longitudinal and lateral motion in said module.

7. The unit according to claim 6, wherein said main printed wiring board assembly includes an electrical receptacle for each function module, each of said receptacles includes means for camming said electrical connectors in said function modules into alignment with said electrical receptacles.

8. A network unit for controlling the operational components of a facility management system, said unit comprising:
   a base frame,
   a number of control modules mounted on said base frame,
   a power module mounted on said base frame for each control module,
   a number of function modules mounted on said base frame,
   a main printed wiring board assembly for electrically interconnecting said function modules, control modules, and power modules, and
   including a number of termination board assemblies mounted on said base frame for connecting the operational components of the facility management system to said main wiring board assembly and wherein said base frame includes a number of slots and a hook at one end of each of said slots and a loop at the other end of each of said slots, and each of said control modules includes means for pivotally engaging said hook and means for locking said modules to said loop.

9. The unit according to claim 8 wherein said locking means includes a latch for engaging said loop and a lock for engaging said latch to prevent release of said latch from said loop.

10. A network unit for controlling the operational components of a facility management system, said unit comprising:
    a base frame, a number of control modules mounted on said base frame, a power module mounted on said base frame for each control module, a number of function modules mounted on said base frame, a main wiring board assembly for electrically interconnecting said function modules, control modules, and power modules, and including a number of termination board assemblies for connecting the operational components of the facility management system to said main wiring board assembly and wherein said main wiring board assembly includes a printed wiring board, an insulation shield mounted on each side of said wiring board and a ground shield mounted on the outside of each of said insulation shields.

11. The unit according to claim 10 wherein said printed wiring board includes a first set of electrical connectors for engaging said function modules, a second set of electrical connectors for engaging said control modules and a third set of electrical connectors for engaging said power modules.

12. The unit according to claim 11 wherein said base frame includes a single frame having means on one side of said frame for forming a ground shield around of said second and third sets of electrical connectors.

13. The unit according to claim 12, wherein said ground shield forming means comprises a number of grooves in said frame and an electrically conductive braid in each of said grooves, said main printed wiring board ground shield including a number of tabs projecting through said frame into electrical communication with said conductive braid in said grooves.

14. The unit according to claim 10 including an enclosure for housing said network control unit, said enclosure including a casing and a removable cover for providing access to said network control unit and a door in said cover for providing access to said modules.

15. The unit according to claim 14 including means for locking said cover to said casing and said door to said cover, said locking means including a first key movable in the direction for opening said cover and a second key movable in the other direction for opening said door.

16. The unit according to claim 15 including a cradle mounted in said casing, a network terminal mounted in said cradle and being operably connected to one of said control modules and an opening in said cover for providing access to said network terminal.

17. The unit according to claim 16 wherein said cradle includes means for releasably locking said network terminal in said cradle.

18. The unit according to claim 17 wherein said locking means is positioned to engage said door when said door is closed whereby said locking means cannot be opened when said door is closed.

19. A network control unit for connecting the communication buses for a facility management system to the operational components of the system, said unit comprising:

a molded one piece base frame having a front and a back, a power assembly and a communication termination board assembly mounted on the front of said frame, a number of termination board assemblies mounted on the front of said frame, a number of function modules removably mounted on the front of said frame, a number of control modules removably mounted on the front of said frame, a number of power modules removably mounted on said frame, a main printed wiring board assembly mounted on the back of said frame for operatively connecting said modules to said termination board assemblies, power assembly and communication termination board assembly and means on said frame for grounding said control modules and said power modules to said main printed wiring board assembly, said grounding means comprising a number of grooves in the front of said frame, and an electrically conductive braid in each of said grooves, said wiring board assembly including a ground shield operably connected through said frame to said braid whereby each of said control and power modules are connected to ground.

20. The unit according to claim 19 wherein said main printed wiring board assembly includes:

a first set of electrical connectors for connecting said function modules to said main wiring board assembly, a second set of electrical connectors for connecting said control modules to said main wiring board assembly, and a third set of electrical connectors for connecting said power modules to said main wiring board assembly.

21. The unit according to claim 20 including first means on said frame for guiding said function modules into electrical engagement with said first set of electrical connectors, second means on said frame for guiding said control modules into electrical engagement with said second set of electrical connectors, and third means on said frame for guiding said power modules into electrical engagement with said third set of connectors.

22. The unit according to claim 20 wherein each of said function modules includes a printed circuit board having an electrical connector at one end, means within said module supporting said board for lateral and longitudinal movement with respect to said function module and means on said printed circuit board for guiding said electrical connector into engagement with one of said first set of electrical connectors on installation of said function module into said frame.

23. The unit according to claim 22 wherein said frame includes a recess along one side of said first set of electrical connectors, and said function module includes a latch pivotally mounted on said module for movement between open and closed positions, said latch including a resilient extension positioned to engage said recess to bias said module into engagement with one of said first set of connectors when said latch is in the closed position.

24. The unit according to claim 20 wherein said frame includes a hook at one end of each of said second and third sets of electrical connectors and a loop at the other end of each of said second and third sets of electrical connectors and said control modules and power modules each include a recess at one end for pivotally engaging said hooks and means at the other end of said modules for securing said modules to said loops, said modules being free to move laterally and longitudinally on said hooks on movement into engagement with said electrical connectors 25. The unit according to claim 24 wherein said securing means includes a latch for engaging said loop and a lock for securing said latch to said loop.

26. The unit according to claim 25 wherein each of said control modules and power modules includes a printed circuit board having an electrical connector mounted thereon, said modules each including means for guiding said connectors into engagement with said second and third set of connectors.

27. The network control unit according to claim 19 including an enclosure for said network control unit, said enclosure including a casing and a cover removably mounted on said casing, a door mounted on said cover to provide access to said modules, and means for selectively locking said cover to said casing and said door to said cover.

28. The network control unit according to claim 27 wherein said locking means is rotated clockwise for unlocking said cover and is rotated counterclockwise unlocking said door.

29. A network control unit for connecting the communication buses for a facility management system to the operational components of the system, said unit comprising:
a one piece base frame having a front and a back,
a power assembly and a communication termination board assembly mounted on the front of said base frame,
a number of termination board assemblies mounted on the front of said frame,
a number of function modules removably mounted on the front of said frame,
a number of control modules removably mounted on the front of said frame,
a number of power modules removably mounted on the front of said frame and a main printed wiring board assembly mounted on the back of said frame for operatively connecting said modules to said termination board assemblies, power assembly and communication termination board assembly, a cradle mounted on said frame and a network terminal removably mounted in said cradle and being operably connected to one of said control modules.

30. The network control unit according to claim 29 wherein said cradle includes means for releasably locking said network terminal in said cradle.

31. A function module for a network control unit having a frame, a pair of parallel walls on said frame for defining a function module cage and a set of function module connectors mounted in a parallel spaced relation between the walls of the cage, said function module comprising:
a cartridge adapted to be mounted on the frame between the walls,
a wiring board mounted in said cartridge, said wiring board including an electrical connector on one end, first means supporting said wiring board for longitudinal movement in said cartridge, second means supporting said board for lateral movement in said cartridge, and
means on said wiring board for camming said electrical connector on said wiring board into engagement with one of the function module connectors when said cartridge is mounted in the cage.

32. The module according to claim 31 wherein each of the walls includes a slot at each end of the function module connectors, and said cartridge includes a rib on each side located in a position to engage the slots in the walls for guiding said module into engagement with the function module connector in the cage.

33. The module according to claim 32 wherein one of the walls includes a lip and said module includes means for engaging the lip to bias said modules into engagement with the function module connectors.

34. The module according to claim 33 wherein said engaging means comprises a latch pivotally mounted on said cartridge for movement between open and closed positions and a resilient extension on said latch for engaging the lip when said latch is in the closed position.

35. A network control unit for controlling the operational components of a facility management system, said unit comprising:
a monolithic base frame having a front and a back,
a main wiring board assembly mounted on the back of said frame,
said main wiring board assembly including a first set of electrical connectors projecting through said frame,
a second set of electrical connectors projecting through said frame, and
a third set of electrical connectors projecting through said frame,
one or more plug-in type function modules mounted on said first set of connectors on the front of said frame,
one or more plug-in type control modules mounted on said second set of connectors on the front of said frame,
one or more plug-in type power modules mounted on said third set of connectors on the front of said frame,
and means on said wiring board assembly for electrically interconnecting said modules, said function modules each include a wiring board having an electrical connector at one end, and means in said modules supporting said wiring board for three directional movement with respect to said first set of connectors.

36. The unit according to claim 35 wherein each of said function module wiring boards include means for guiding said electrical connectors into engagement with said first set of connectors.

37. A network control unit for controlling the operational components of a facility management system, said unit comprising:
a base frame assembly including a monolithic frame having a front and a back, p1 a main wiring board assembly mounted on the back of said frame,
said main wiring board assembly including a first set of electrical connectors projecting through said frame,
a second set of electrical connectors projecting through said frame, and
a third set of connectors projecting through said frame,
one or more plug-in type function modules mounted on said first set of connectors on the front of said frame,
one or more plug-in type control modules mounted on said second set of connectors on the front of said frame,
one or more plug-in type power modules mounted on said third set of connectors on the front of said frame, and means on said wiring assembly electrically interconnecting said modules
wherein said frame includes a hook on one end and a loop at the other end of each of said second and third sets of connectors and each of said control modules and power modules includes means for pivotally engaging said hook and means for manually securing said modules to said loops.

38. A function module for a network control unit including a monolithic frame having a front and a back and a main wiring board assembly mounted on the back of the frame, said wiring board assembly including a number of function module connectors mounted thereon, said module comprising:
   a circuit board assembly mounted in said cartridge, said circuit board assembly including an electrical connector mounted on one end in a position to engage one of the function module connectors on the main circuit board assembly,
   means on said cartridge for securing said cartridge to the frame and means in said cartridge supporting said circuit board assembly for three directional movement with respect to the electrical connectors on the main circuit board assembly.

39. The module according to claim 38 wherein said securing means comprises a latch pivotally mounted on said cartridge for movement between open and closed positions with respect to the frame, said latch including a resilient arm positioned to engage the frame to bias the cartridge into engagement with the electrical connector on the main wiring board assembly when said latch is in the closed position.

40. The module according to claim 39 wherein said latch includes means for locking the latch to the cartridge in the closed position.

41. A function module for a network control unit having a monolithic frame and a main wiring board assembly mounted on the frame, said wiring board assembly including a number of electrical connectors mounted thereon, said module comprising:
   a cartridge,
   a circuit board assembly mounted in said cartridge, said circuit board assembly including an electrical connector at one end positioned to engage one of the electrical connectors on the main circuit board assembly, and
   means on said cartridge for securing said cartridge to said frame and including a pair of switches mounted on said circuit board assembly, a cap mounted on said switches and means mounted on said circuit board assembly and operably connected to said cap for selectively activating said switches.

42. An electronic cartridge adapted to be connected to a frame, the frame having a cage formed thereon for receiving said cartridge, a first set of electrical connectors mounted in the cage in the frame, said cartridge comprising a housing of a shape to fit into the cage, a printed circuit board mounted within said housing and having electronic components thereon,
   a second electrical connector mounted at one end of said circuit board and being connected to said electronic components, said second electrical connector being adapted to mate with one of said first set of electrical connectors upon said cartridge being inserted into said cage and a lever mounted on said housing and being moveable between first and second positions, said lever including locking means adapted to engage the cage to hold said cartridge in said cage with said second electrical connector connected to one of the first set of connectors, said cartridge including means supporting said printed circuit board for longitudinal and lateral motion with respect to the first electrical connectors, and means for camming said printed circuit board into alignment with the first electrical connectors.

43. A network control unit for coordinating the operation of the operational components of a building, said unit comprising:
   a base frame assembly including,
   a main printed wiring board mounted on one side of said frame,
   a number of termination board assemblies mounted on the other side of said frame for electrically connecting the incoming and outgoing cables for the various operational components to said main wiring board assembly,
   a number of function modules, control modules and power modules removably mounted on the other side of said frame,
   a communication termination board assembly mounted on the other side of said frame;
   a power termination board mounted on the other side of said frame, and
   a preload resistor mounted on said other side of said frame, said wiring board assembly operatively interconnecting said modules, termination board assemblies, communication termination board assembly, power termination board and preload resistor whereby all of the operational components of the building are coordinated through the network control unit, said wiring board assembly including means for grounding said control modules, power modules, communication termination board assembly, power termination board and preload resistor when mounted on said frame and said frame including a base, a function module cage on said base and means in said cage for aligning said function modules in a parallel spaced relation on said base.

44. The assembly according to claim 43 wherein said base includes a number of slots located in a parallel spaced relation and said wiring board assembly includes an electrical connector corresponding to each of said slots and means on said base for securing said control and power modules to said base with said modules electrically connected to said connectors.

45. The assembly according to claim 44 wherein said securing means comprises a hook at one end and a loop at the other end of each of said slots and said modules include means for pivotally engaging said hooks and means for locking said modules to said loops.

46. The unit according to claim 43 wherein said wiring board assembly includes a ground shield between said other side of said frame and said main wiring board assembly, said control modules and power modules include electrically conductive cartridges, and said frame includes a plurality of grooves in said other side of said frame, an electrically conductive braid in each of said grooves for engaging said cartridges when mounted on said frame, and means for connecting said braid to said ground shield on said main wiring board assembly.

47. The unit according to claim 46 wherein said connecting means comprises a plurality of tabs in said ground shield which project through said frame into said braid.

48. The unit according to claim 46 wherein said main printed wiring board assembly includes means for grounding said termination board assemblies, communication termination board assembly, power termination board and preload resistor.

49. A network control unit for monitoring and controlling all of the operational components of a building, said unit comprising:
a modular base frame having a front and a back,
a wiring board assembly mounted on the back of said base frame,
a number of termination board assemblies mounted on the front of said base frame and being operably connected to said wiring board assembly,
a function module mounted on the front of said base frame and being operably connected to said wiring board assembly,
a digital control module mounted on the front of said base frame and being operably connected to said wiring board assembly,
an expansion module mounted on the front of said base frame and being operably connected to said wiring board assembly,
a network control module mounted on the front of said base frame and being operably connected to said wiring board assembly,
a power module mounted on the front of said base frame for each digital, expansion and network module mounted on said base frame, each power module being operably connected to said wiring board assembly,
a power termination board mounted on said base frame and being operably connected to said wiring board assembly,
a communication termination board mounted on said base frame and being operably connected to said network control module whereby input signals from the operational components are monitored by said modules through the wiring board assembly and output signals from said modules are transmitted through the wiring board assembly to the operational components and
means for grounding said digital, expansion, control and power modules, and said communication termination board and said power termination board, through said wiring board assembly, said grounding mans including an electrically conductive braid in the front of said frame.

50. The network control unit according to claim 49 wherein said digital, expansion and control modules each include an electrically conductive casing positioned to engage said braid.

* * * * *